United States Patent
Inada et al.

(10) Patent No.: US 7,435,957 B2
(45) Date of Patent: Oct. 14, 2008

(54) CHARGED PARTICLE BEAM EQUIPMENT AND CHARGED PARTICLE MICROSCOPY

(75) Inventors: Hiromi Inada, Hitachinaka (JP); Mitsugu Sato, Hitachinaka (JP); Atsushi Takane, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 173 days.

(21) Appl. No.: 11/302,323

(22) Filed: Dec. 14, 2005

(65) Prior Publication Data
US 2006/0151697 A1    Jul. 13, 2006

(30) Foreign Application Priority Data
Dec. 17, 2004   (JP)   ............... 2004-366607

(51) Int. Cl.
*G01N 23/00*   (2006.01)
(52) U.S. Cl. ............. 250/310; 250/306; 250/307; 250/309; 250/311; 702/85
(58) Field of Classification Search ........... 250/306, 250/307, 309, 310, 311; 702/85
See application file for complete search history.

(56) References Cited

U.S. PATENT DOCUMENTS

| | | | |
|---|---|---|---|
| 6,791,084 B2 | 9/2004 | Shimoma et al. | |
| 6,797,965 B2* | 9/2004 | Abe | 250/491.1 |
| 6,838,667 B2* | 1/2005 | Tsuneta et al. | 250/306 |
| 2002/0056808 A1* | 5/2002 | Tsuneta et al. | 250/306 |
| 2003/0201393 A1* | 10/2003 | Tsuneta et al. | 250/311 |
| 2005/0189501 A1* | 9/2005 | Sato et al. | 250/492.22 |

FOREIGN PATENT DOCUMENTS

| | | | |
|---|---|---|---|
| JP | 2002-15691 A | | 1/2002 |
| JP | 2002015691 A | * | 1/2002 |
| JP | 2005209488 A | * | 8/2005 |

* cited by examiner

*Primary Examiner*—Jack I. Berman
*Assistant Examiner*—Michael Maskell
(74) *Attorney, Agent, or Firm*—McDermott Will & Emery LLP

(57) ABSTRACT

On the basis of a displacement of the field of view before and after a deflection of a charged particle beam, extracted from a first specimen image, including a displacement of the field of view recorded by causing a charged particle beam to deflect by a predetermined amount by a beam deflector in an image in which a specimen image is captured at a first magnification calibrated by using a specimen enlarged image of a specimen as a magnification standard, and also a displacement of the field of view before and after a deflection of the charged particle beam, extracted from a second specimen image, including a displacement of the field of view recorded by causing a charged particle beam to deflect by the predetermined amount by the beam deflector in an image in which a specimen image is captured at a second magnification, the second magnification is calibrated.

22 Claims, 17 Drawing Sheets

FIG. 11A
DETECTING
AREA
SELECTION
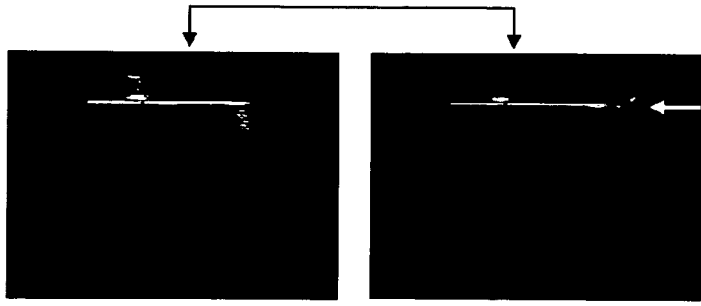
FIG. 11B
CUT-LINE IN
Y-DIRECTION
DETECTION
CUT-LINE
FIG. 11C
DEFERENTIAL
OF IMAGE IN
Y-DIRECTION
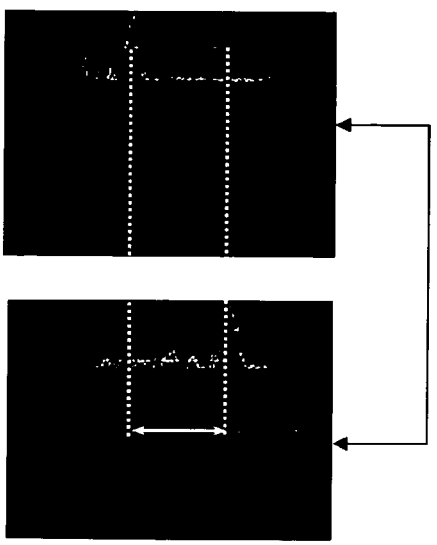
FIG. 11D
PARALLAX
COMPUTING
CORRELATION
PROCESSING
FIG. 11E

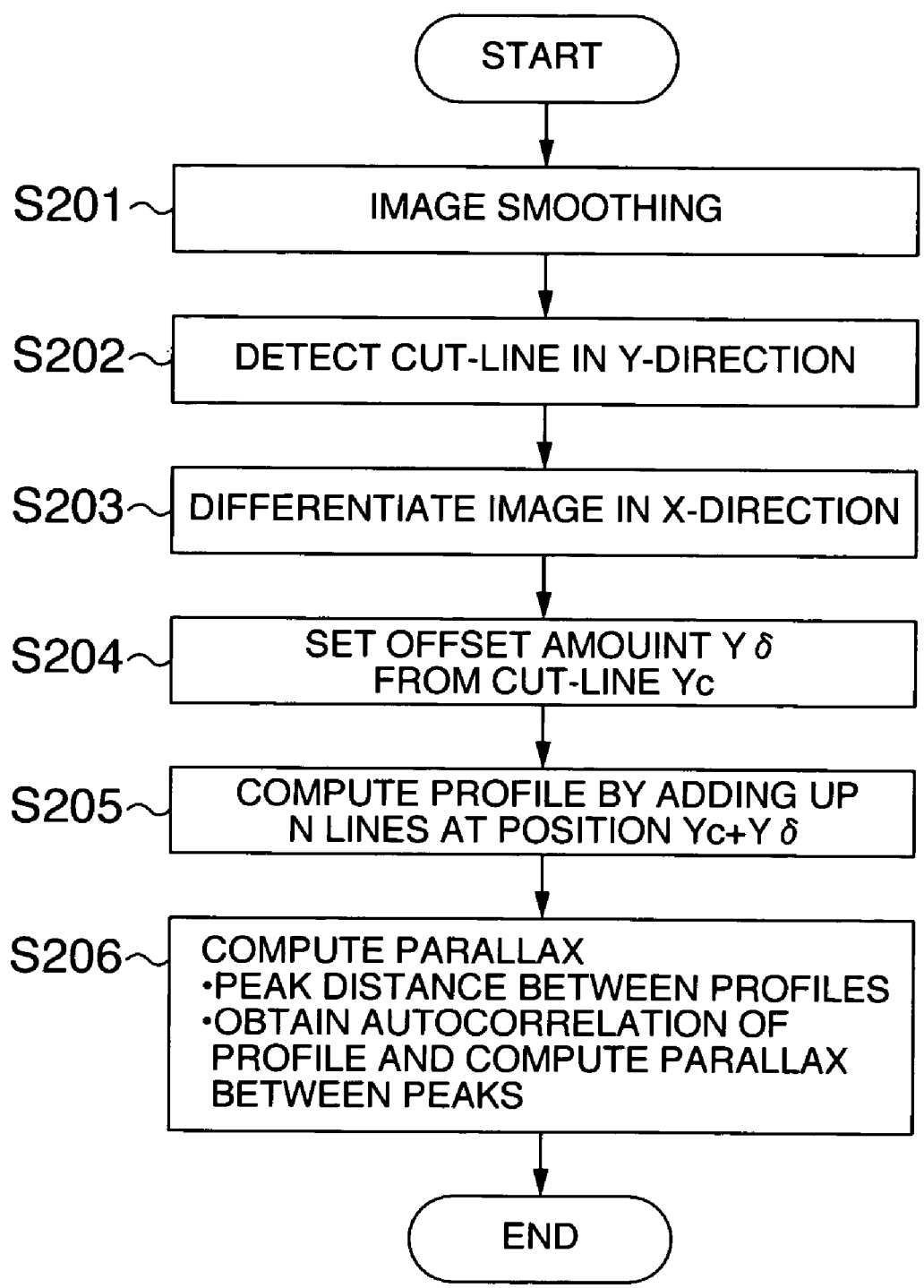

| DISPLAY MAGNIFICATION | X-MAGNIFICATION | X PARALLAX ERROR $\varepsilon_X$ | Y-MAGNIFICATION | Y PARALLAX ERROR $\varepsilon_Y$ |
|---|---|---|---|---|
| 1000 | 1005 | +0.5% | 1010 | +0.1% |
| 10000 | 10010 | +0.1% | 9950 | -0.5% |
| 50000 | 49902 | -0.2% | 50550 | +1.1% |
| 100000 | 102200 | +2.2% | 103630 | +3.6% |
| ---------- | ---------- | -------- | ---------- | -------- |
| 1000000 | 1045400 | +4.5% | 1014200 | +1.4% |

SPECIMEN WITH PERIODIC STRUCTURE

FOURIER TRANSFORMED IMAGE OF SPECIMEN WITH PERIOD STRUCTURE

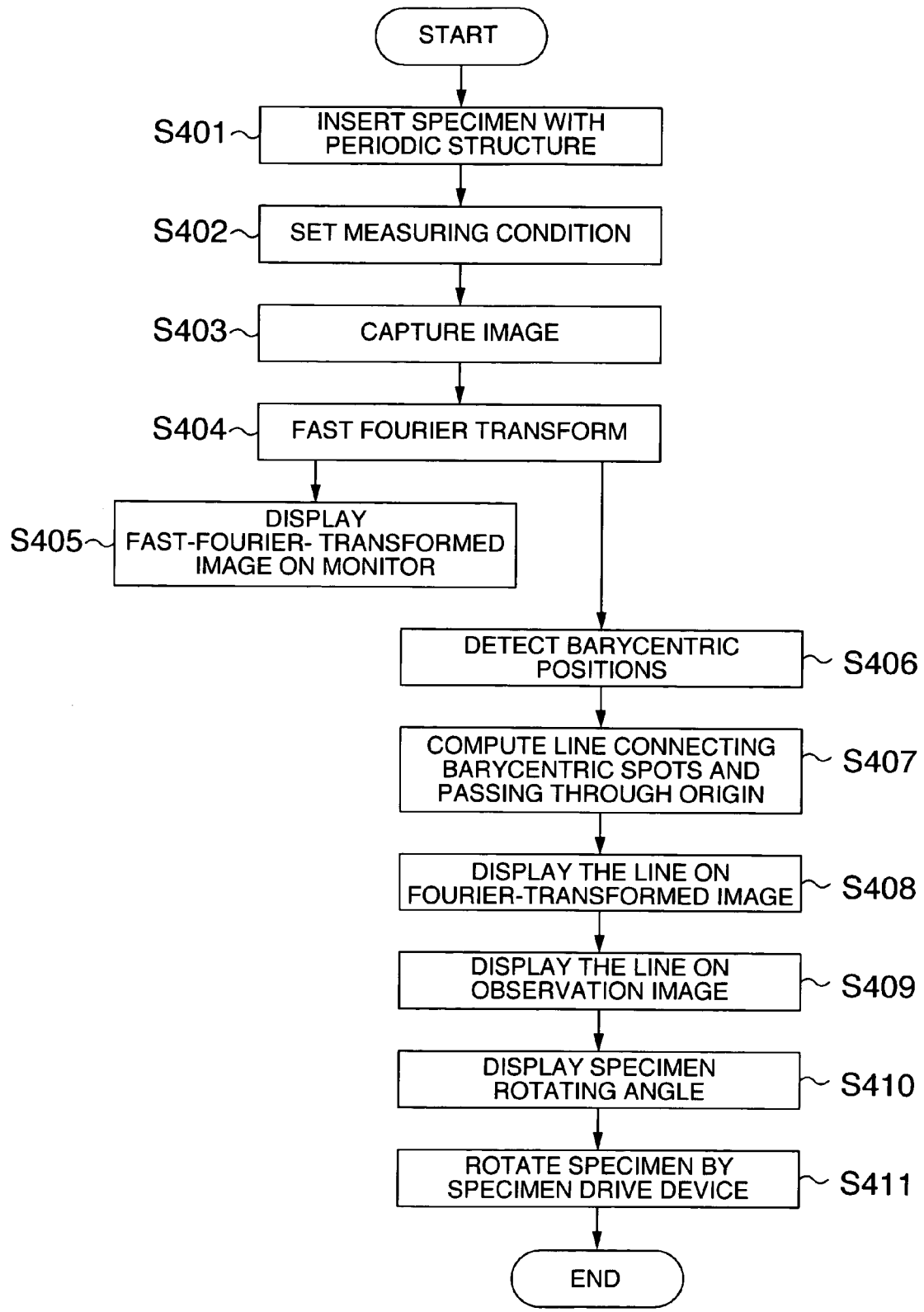

DISPLAY IMAGE
AND FFT AREA

REAL TIME
DISPLAY FFT IMAGE
AND SPECIMEN
ROTATING ANGLE

SPECIMEN ROTATING ANGLE 10deg

CHARGED PARTICLE BEAM EQUIPMENT AND CHARGED PARTICLE MICROSCOPY

CROSS-REFERENCE TO RELATED APPLICATION

The present invention is related (1) U.S. Pat. No. 6,791,084 and (2) U.S. patent application Ser. No. 11/038,478 entitled "CHARGED PARTICLE SYSTEM AND A METHOD FOR MEASURING IMAGE MAGNIFICATION" filed on Jan. 23, 2004. The disclosure of the above U.S. patent and application is herein incorporated by reference.

BACKGROUND OF THE INVENTION

1. Field of the Invention

The present invention relates to charged particle beam equipment for scanning a charged particle beam over a specimen, and forming an image by using a signal generated when the specimen is irradiated by a charged particle beam.

2. Description of the Related Art

Heretofore, with charged particle beam equipment, such as a scanning electron microscope, a focused ion beam observation device, and a transmission electron microscope, when calibrating a magnification and a measured length of images accurately, is has been a usual practice to measure an interval dimension representing the feature of a specimen by using a microscale specimen whose dimension is known, or using scanning a secondary-electron image or a scanning transmitted electron image of crystal lattice. As a conventional technology for calibrating a display magnification by using a standard specimen, there is a technology revealed in JP-A-2002-15691. In JP-A-2002-15691, a specimen is not specified, but it is stated that when the acceleration speed or the working distance changed in a scanning electron microscope, by measuring a change in magnification, the display magnification or the scale bar is calibrated.

FIG. 2A is an enlarged view of a microscale specimen, which is generally available in the market, and in which the pitch distance is 0.24 μm. FIG. 2B is a crystal fringe image of a gold single crystal thin-film specimen, in which the lattices with a crystal lattice spacing of 0.204 nm intersect with one another. For example, to use a gold single crystal thin-film specimen as a dimensional standard, it is necessary to take an enlarged image of a specimen at a magnification at which-crystal lattice images of gold can be observed, and to enlarge a lattice image with of an interval of 0.204 nm to an interval of 1 mm, it is necessary to multiply 0.204 nm by a magnification of $5000 \times 10^3$. Under an actual scanning transmitted electron microscope, to make this lattice image large enough to recognize lattices in the image, it is necessary to provide a magnifying power of not less than $3000 \times 10^3$. Calibration of an observation magnification or a measured length by using a lattice fringe image proceeds as follows at a magnification used in photographing. Suppose that the magnification (display magnification) displayed on the electron microscope was $3000 \times 10^3$, and when a gold single crystal specimen with a crystal lattice spacing of 0.204 nm was photographed, and the lattice interval displayed was 0.62 mm, the true magnification at this time can be obtained as:

$$0.62 \text{ mm}/0.204 \text{ nm} = 3039.22 \times 10^3.$$

In other words, the display magnification includes an error of 1.31%. Similarly, the dimension (measured length) between two points in an image taken at this display magnification was displayed 1.31% larger than it actually is.

SUMMARY OF THE INVENTION

In a conventional calibration of a magnification and a measured length using a standard dimension specimen, a specimen enlarged image serving as a dimensional standard must be photographed properly and there are restrictions observable on magnifications. It is possible to calibrate magnification and measured length values only at a magnification at which a specimen enlarged image was photographed. For example, microscale specimens with a pitch interval of 0.24 μm cannot be used in the entire range of magnifications of a scanning electron microscope, above all, those specimens cannot be used for calibration of high magnifications. Similarly, even when a lattice image of a gold single crystal thin-film specimen with a crystal lattice spacing of 0.204 nm is used as a dimensional standard, it cannot be applied to the entire range of observation magnifications of the electron microscope.

An object of the present invention is to provide charged particle beam equipment capable of calibrating a magnification and a measured length even in a range of magnifications other than the optimum observation magnification of a standard dimension specimen.

A second object of the present invention is to provide charged particle beam equipment capable of dimensional calibration both at low observation magnifications and at high observation magnifications with one kind of a standard dimension specimen without using different specimens for providing standard sizes.

A third object of the present invention is to provide charged particle beam equipment in which variations in magnification error and measurement error between magnification steps and magnification ranges are reduced to a fixed level. The present invention ensures dimensional accuracy between different magnifications and between different ranges of magnification by using the same specimen.

A fourth object of the present invention is to curb a decrease in magnification calibration accuracy attending on a specimen drift.

In the present invention, initially, a displacement of the field of view is obtained before and after a deflection of a charged particle beam, extracted from a first specimen image, including a displacement of the field of view recorded by causing a charged particle beam to deflect by a beam deflector by a predetermined amount in an image where a specimen image is obtained at a first magnification, and also a displacement of the field of view is obtained before and after a deflection of the charged particle beam, extracted from a second specimen image, including a displacement of the field of view recorded by causing a charged particle beam to deflect by the beam deflector by a predetermined amount in an image where a specimen image is obtained at a second magnification. Then, on the basis of the obtained amount of displacement of the field of view of the first specimen image and the obtained amount of another displacement of the field of view of the second specimen image, the amount of magnification error at the second magnification is made equal to the amount of magnification error at the first magnification. In addition, by having the first magnification previously calibrated by using a sample enlarged image of the specimen serving as a magnification standard, the second magnification is calibrated by the same method.

According to the present invention, by reducing effects of specimen drift, it becomes possible to calibrate a magnification error in other observation magnifications with a magnification error equal to that of a reference magnification. By using a dimensional standard specimen for calibrating the magnification of the reference magnification, it is possible to calibrate magnification errors at other observation magnifications for which a dimensional standard specimen cannot be used.

Other objects, features and advantages of the invention will become apparent from the following description of the embodiments of the invention taken in conjunction with the accompanying drawings.

BRIEF DESCRIPTION OF THE DRAWINGS

FIGS. 11A to 11E are pictures of a process of detecting an amount of parallax in an image where the field of view was shifted by using a beam deflector;

FIG. 12 is a flowchart showing a process of detecting an amount of parallax in an image where the field of view was shifted by using a beam deflector;

FIG. 18 is a flowchart showing methods for displaying a FFT image and a specimen rotation angle by measuring a specimen rotation angle of a periodic specimen as a magnification standard, and rotating the specimen by a specimen drive unit.

DESCRIPTION OF THE INVENTION

Description will be made of an embodiment of the present invention with reference to the accompanying drawings. The present invention is applicable to cases where the charged particle beam is an ion beam or an electron beam; however, the present invention will be described referring to a case where the charged particle beam is an electron beam in the following. In addition, the lens system, the beam deflector and the scanner may be either of the type using an electric field or of the type using a magnetic field; however, description will be made of a case where those devices of the magnetic field type are used. It does not matter at all whether there is a projection lens under a specimen or how many stage the projection lens may be.

Figure 1:
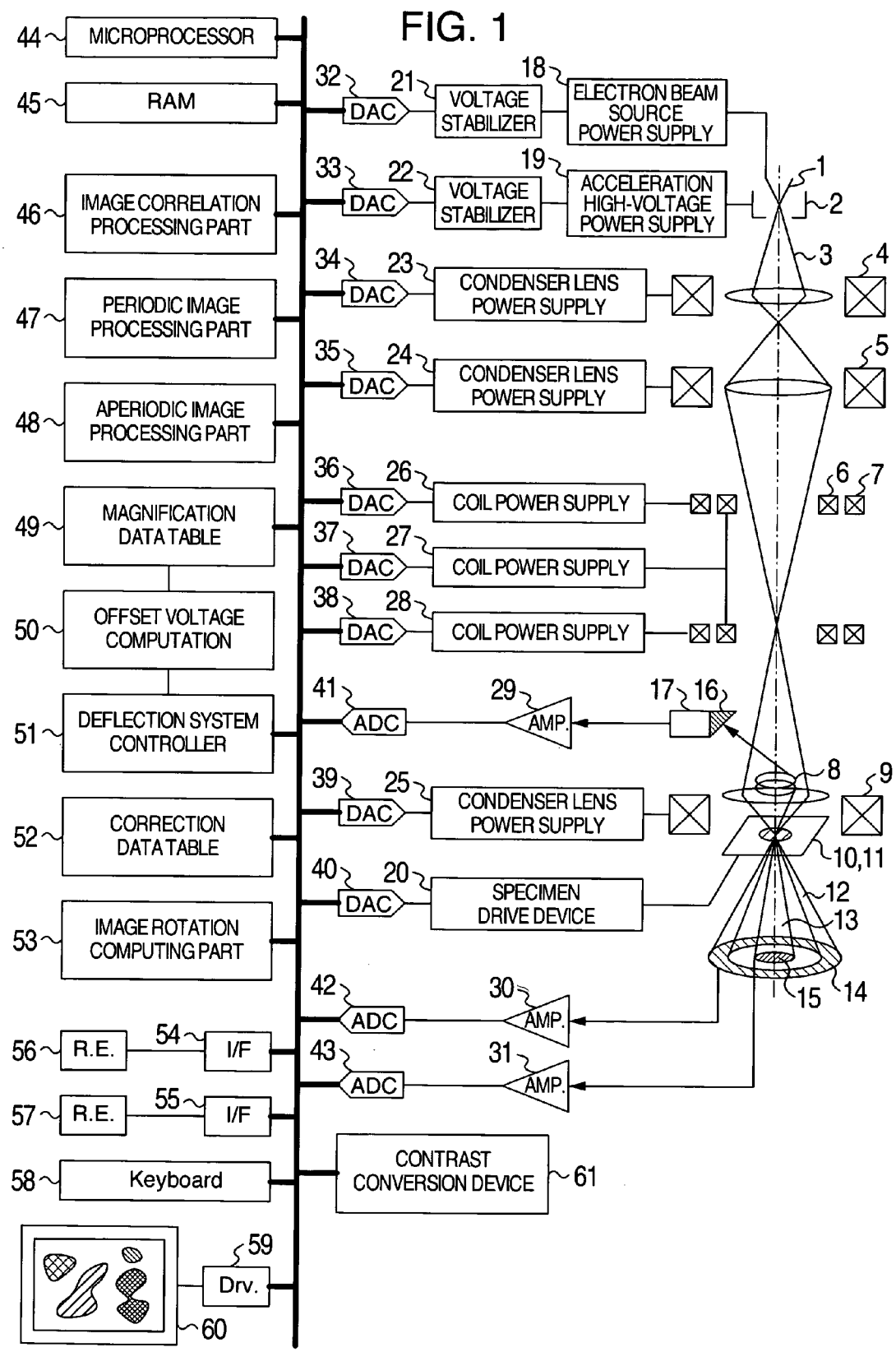
FIG. 1 is a diagram showing a structural example of charged particle beam equipment of the present invention.

FIG. 1 is a schematic function block diagram as an example of charged particle beam equipment according to the present invention.

An electron beam (charged particle beam) 3 emitted from an electron beam source (charged particle beam source) 1 is accelerated by an accelerating electrode 2, passes through a pre-magnetic field by a first condenser lens 4, a second condenser lens 5, and an objective condenser lens 9, and illuminates a specimen 11 held on a specimen stage 10. When the electron beam 3 illuminates the specimen 11, by an interaction between the specimen 11 and the electron beam, secondary electrons 8 having information on the specimen, specimen forward scattering electrons 12, and specimen transmitted electrons 13 are generated. The electron beam 3 incident on the sample is made to scan over the surface of the specimen by scanning coils 13 disposed symmetrically about an optic axis of the electron beam. By synchronizing scanning of the electron beam with scanning of the image, an enlarged image of the specimen is formed on the display part 60. The secondary electrons 8 generated at the specimen cause a phosphor 16 to glow and are detected by a photonelectron multiplier tube 17, and multiplied by a minute electric current multiplier 29, and captured into a data bus by an A/D converter 41. The phosphor 16 and the photonelectron multiplier tube 17 are used here as the detectors of secondary electrons, but a semiconductor detector, such as a multi-channel plate, may be used for this purpose. The specimen forward scattering electrons 12 are detected by a forward scattering electron detector 14, and the specimen transmitted electrons 13 are detected by a specimen transmitted electron detector 15. Those detectors 14 and 15 may be formed by combining a phosphor and a photonelectron multiplier tube or may be formed by semiconductor detectors. The accelerating voltage, the electron beam extraction voltage, and the filament voltage of the electron beam source 1 and the accelerating electrode 2 are set by an electron beam source power supply 18 and a high-voltage supply 19 for acceleration when instructions are issued from a microprocessor 44 and transmitted through the data bus to D/A converters 32 and 33 and resulting analog signals are supplied to the electron beam source power supply 18 and the high-voltage source 19. Exciting currents are supplied to the first condenser lens 4, the second condenser lens 5, and the objective condenser lens 9 by analog signals from D/A converters 34, 35, and 39, to which instructions are supplied from the microprocessor 44. The position of the specimen 11 is controlled by driving the specimen stage 10 by the operator using rotary encoders 56, 57, or by driving the specimen stage 10 according to a specimen position drive pattern, which is to be recorded previously.

The scanning quantity of electron beam on the specimen may be arbitrarily changed according to a magnitude of an electric field or a magnetic field applied to the electron beam by the scanning mechanism. In a specimen enlarged image by secondary electrons, for example, the magnification in enlarging a secondary electron image may be changed by changing the magnitude of a current applied to the scanning coils 6 or by changing the scanning area of an electron beam 3 on the specimen. More specifically, by narrowing down the scanning area of the electron beam on the specimen, the magnification in enlarging a secondary electron image becomes large, or by widening the scanning area, the enlarging magnification becomes small.

Figure 3A:
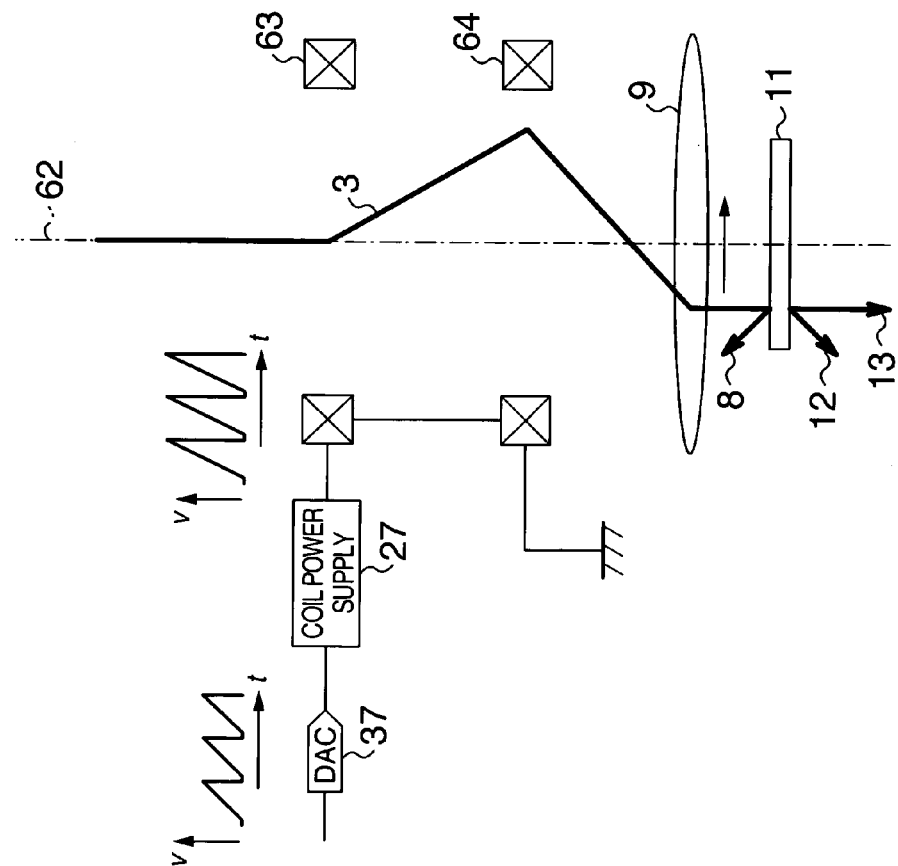
FIGS. 3A, 3B, and 3C are diagrams showing the principle of an electron beam scanning mechanism.
Figure 3B:
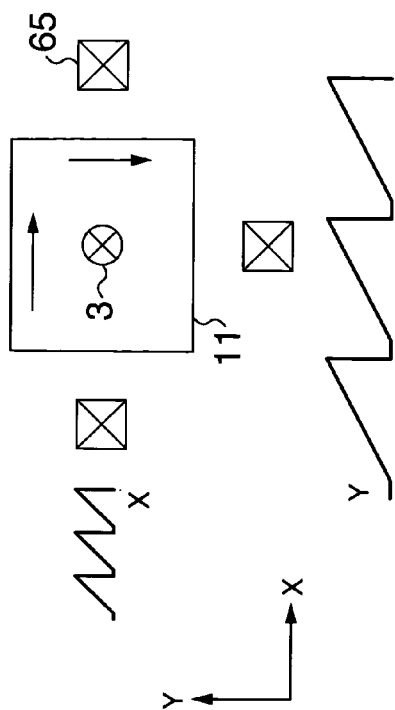
Figure 3C:
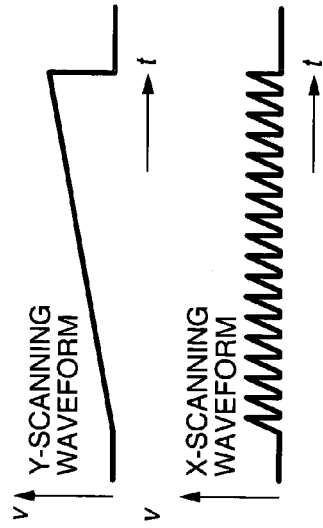

FIGS. 3A, 3B, 3C are diagrams showing the principle of the scanning mechanism of an electron beam. The electron beam 3 travels along its optical axis 62. The scanning coils 63, 64 are arranged to be concentric with the optical axis of the electron beam and symmetric about both the X and Y axes. To apply an electron beam perpendicular to the specimen, the scanning coils are arranged so that they are placed at two, upper and lower, stages. A saw-tooth voltage signal is applied to the upper scanning coil 63 and the lower scanning coil 64, and when the electron beam reaches the front focus position on the optical axis of the objective condenser lens 9, the electron beam perpendicularly incident on the specimen interacts with the specimen, so that secondary electrons 8, specimen forward scattering electrons 12, and specimen transmitted electrons are obtained. By having the secondary electrons 8, the specimen forward scattering electrons 12, and the specimen transmitted electrons 13 synchronize with the scanning waveforms, a specimen enlarged image is formed. The magnification of the specimen enlarged image depends on the voltages of the scanning waveforms applied to the X- and Y-scanning coils.

Figure 4A:
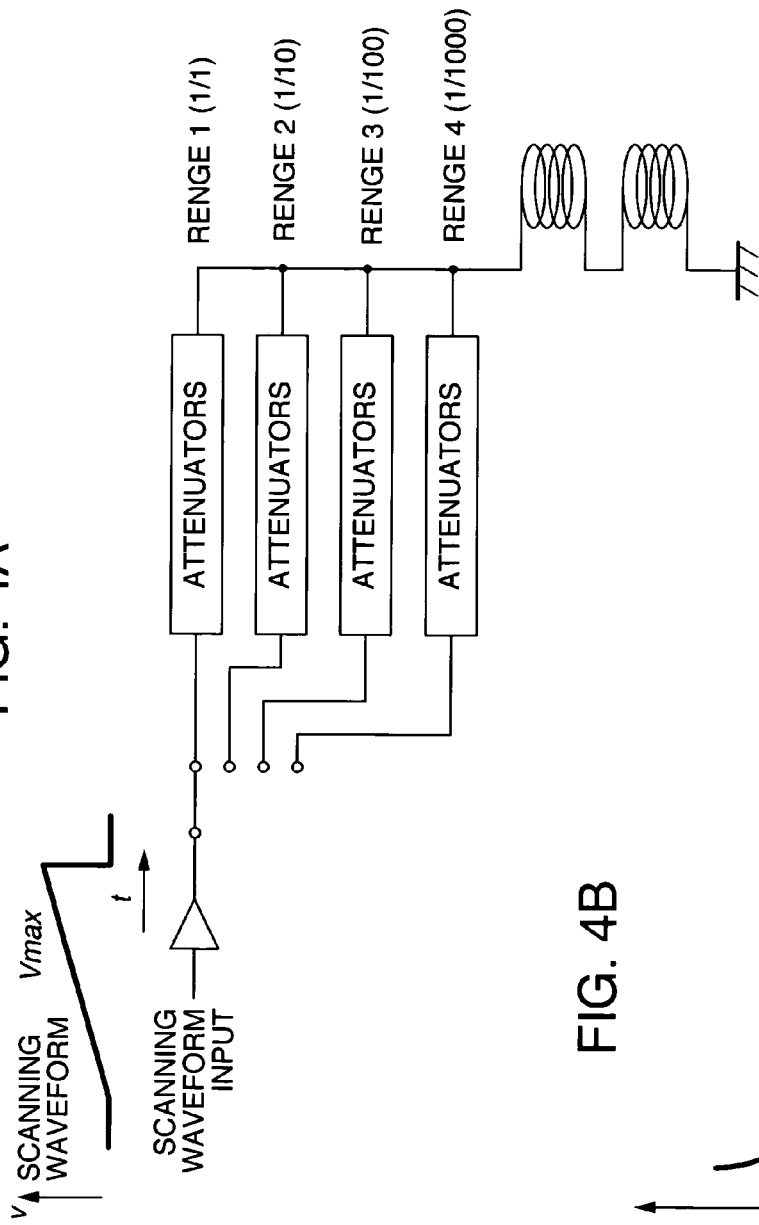
FIGS. 4A and 4B are a diagram showing the principle of changing magnification ranges of the scanning mechanism and a graph showing the relation between enlarging magnifications and voltages applied to the scanning coil.
Figure 4B:
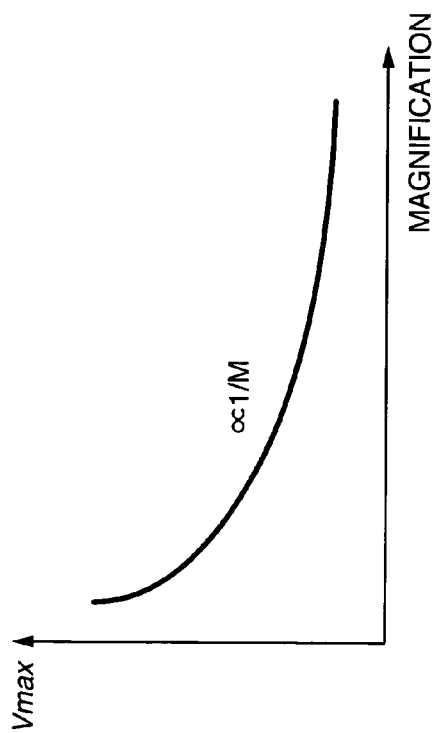

FIG. 4B is a graph showing a relation between the specimen enlarging magnification M and the maximum value Vmax of the scanning waveform voltage, in which the maximum value Vmax of the scanning waveform voltage is inverse proportion to the specimen enlarging magnification M. If the voltage of the scanning waveform is varied continuously by means of a variable resistor, it is logically possible to secure magnifications of infinite kinds; however, in practical use, continuous variability in magnification is unwieldy and is not necessary. Generally, the voltage can be switched over in a step-like manner. To be compatible with observation magnifications of a range as wide as $10^3$, a standard voltage of the scanning waveform is passed through voltage attenuators separated one range from another as shown in FIG. 4A, and different waveforms are input to the scanning coils. The step-like change-over of magnification, for example, in specimen enlarging magnifications are 1000 times, 1500 times, 2000 times, 3000 times, and so on. As for an example of ranges, range 1 is from 1000 times to 2000 times, range 2 is from $10 \times 10^3$ times to $90 \times 10^3$ time, range 3 is from $100 \times 10^3$ times to $900 \times 10^3$ times, and range 4 is from $1000 \times 10^3$ times to $9000 \times 10^3$ times.

Description will start with magnification steps and variation in accuracy of enlarging magnification. The accuracy of each specimen enlarging magnification is determined by the accuracy of the voltage of the scanning waveform. In a system in which scanning voltages are applied to the scanning coils 63, 64 by a DAC 37 and a coil power source 27 as shown in FIGS. 3A, 3B, 3C, the accuracy of the specimen enlarging magnification chiefly depends on errors output from DAC 37 and quantum errors of the minimum bit (LSB) of the DAC. On the other hand, as shown in FIG. 4A, as the attenuators to change magnification ranges, fixed resistors are used. The magnification errors between the magnification ranges depend on inherent errors, such as fabrication errors in the fixed resistors. The fixed resistor has permissible errors which are about ±0.1% of its own resistance value. To take an example, 10V is applied to the scanning coils as the maximum voltage value of a scanning wave at an enlarging magnification of 1000 times of range 1, and at 10000 times of an enlarging magnification of range 2, on the other hand, 1V which is 1/10 of the above 10V is applied to the scanning coils by passing through a voltage attenuator. If a magnification error is +0.1% in range 1, an image is recorded with the magnification error is 1001 times larger when an enlarging magnification is 1000 times, and if a magnification error is −0.1% in range 2, an image is recorded with the magnification error is 9990 time larger when an enlarging magnification is 10000 times. This can be said that attenuators with different error constants are used in range 1 and in range 2, with the result that accuracy differs with different enlarging magnifications.

When calibrating a magnification accuracy or a measured length at different magnifications, initially, a magnification is calibrated by using a standard dimension specimen at a magnification which makes it possible to observe a characteristic structure of a standard dimension specimen. Then, under the above magnification, an arbitrary voltage is input to the electron beam deflection circuit and a parallax (a displacement of the field of view) of an image is obtained. A specimen drift in detecting the parallax gives rise to an error in a magnification calibration value. As a countermeasure for this problem, charged particle beam equipment in the present invention measures a parallax taking into consideration effects from the drift when measuring a parallax by using the electron beam deflection circuit.

Figure 5:
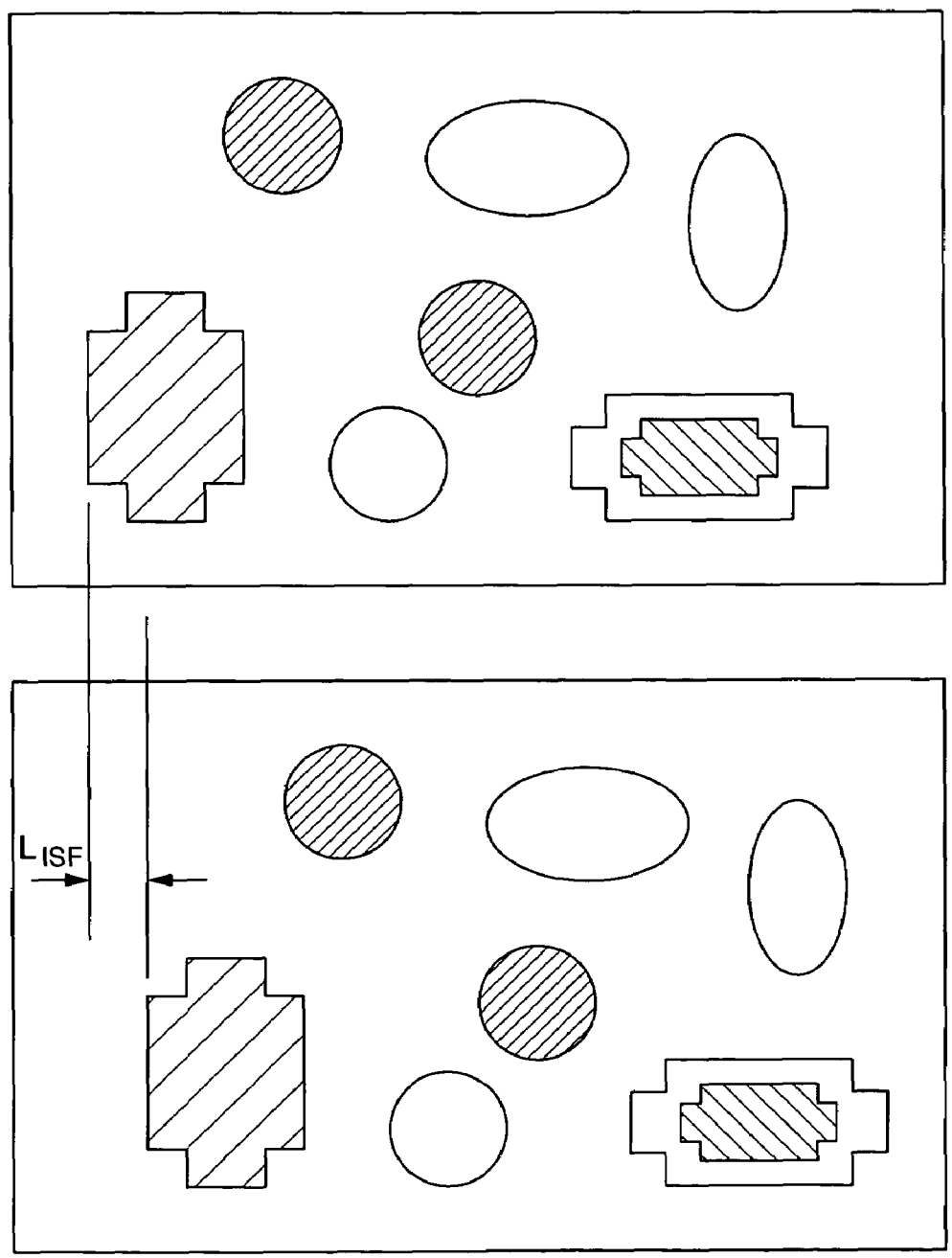
FIG. 5 is a diagram showing examples of image when the field of view was moved by using a beam deflector.

FIG. 5 shows, by way of example, images when the field of view was moved by the electron beam deflection circuit. It is no problem if an amount of displacement of the field of view is purely a value proportional to a voltage applied to the electron beam deflection circuit. However, the specimen stage of an actual electron beam equipment moves freely without stopping just after the specimen stops moving or a specimen drift occurs by heat; therefore, the moving amount of the field of view is expressed by a sum of a field-of-view displacement caused by the drive of the electron beam deflection circuit and an amount of specimen drift. In other words, a true field-of-view moving amount $L_{ISF}$ by the drive of the electron beam deflection circuit is obtained by Equation (1) from a measured field-of-view moving amount $L_{tot}$ and a moving amount $L_{drift}$ by specimen drift.

$$L_{ISF}(t)=L_{tot}(t)-L_{drift}(t) \qquad (1)$$

Incidentally, the drift amount occurs not selectively in one direction but in two directions, hence a vector quantity. Since the drift amount changes with passage of time, and it can be given as a function of time. When comparing parallaxes of two images, there is no problem if the magnification of an observation image is so small that the drift amount can be neglected. However, at such an observation magnification that a drift amount can be observed, it is difficult to measure an image parallax purely by the electron beam deflection circuit due to a mixing of drift from one image and another image taken at different times.

By using a flowchart in FIG. 6, description will be made of a method of calibrating a variation in accuracy of enlarging magnification at each observation magnification step of a specimen enlarged image on the electron beam equipment.

Figure 6:
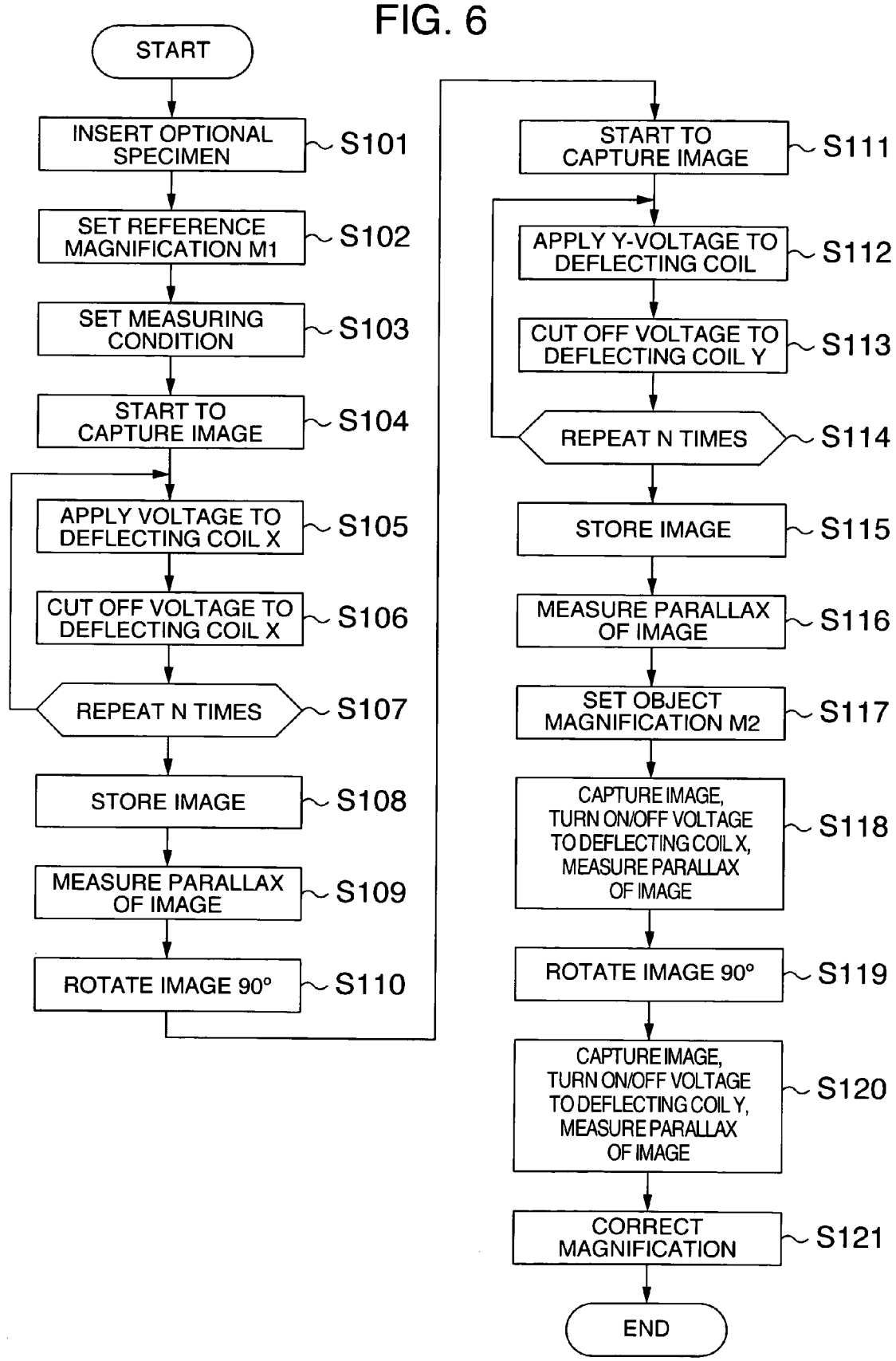
FIG. 6 is a flowchart for explaining a process for reducing dimensional errors between ranges.

The flow in FIG. 6 can be divided into two major processes. As a first process, a process is provided which comprises applying a voltage of an optional magnitude to the electron beam deflector at a reference magnification and measuring a parallax of an image, and after rotating the image 90°, again applying a voltage of another optional magnitude to the electron beam deflector and measuring a parallax of an image (Steps 101 to 116). A second process comprises applying, at an object magnification, the same voltage as applied to the electron beam deflector at the reference magnification and measuring a parallax of an image, and after rotating the image 90°, again applying the same voltage to the electron beam deflector as applied at the reference magnification and measuring a parallax of an image to thereby calibrate the object magnification (Steps 117 to 121).

In Step 101, a specimen of an arbitrary structure is placed on the specimen stage, and inserted into the electron beam equipment.

In Step 102, a reference magnification is set, and a voltage to be applied to the scanning coils is decided. The reference magnification mentioned here is an observation magnification as a standard for magnification errors and is denoted as $M_1$. In Step 103, an acceleration voltage is set, and the electron beam irradiation conditions are set. In Step 104, photography of an enlarged image of the specimen inserted in Step 101 is started. A condition for photography is that it is possible to adjust time for forming an image. Another condition is that the size of an image can be adjusted regardless of what size the image may be. For example, in an image in FIG. 10, for a horizontal pixel size A×a vertical pixel size B, numbers are set as 640 pixels (horizontal)×480 pixels (vertical), and 20 s is set for the image capture time.

Figure 10:
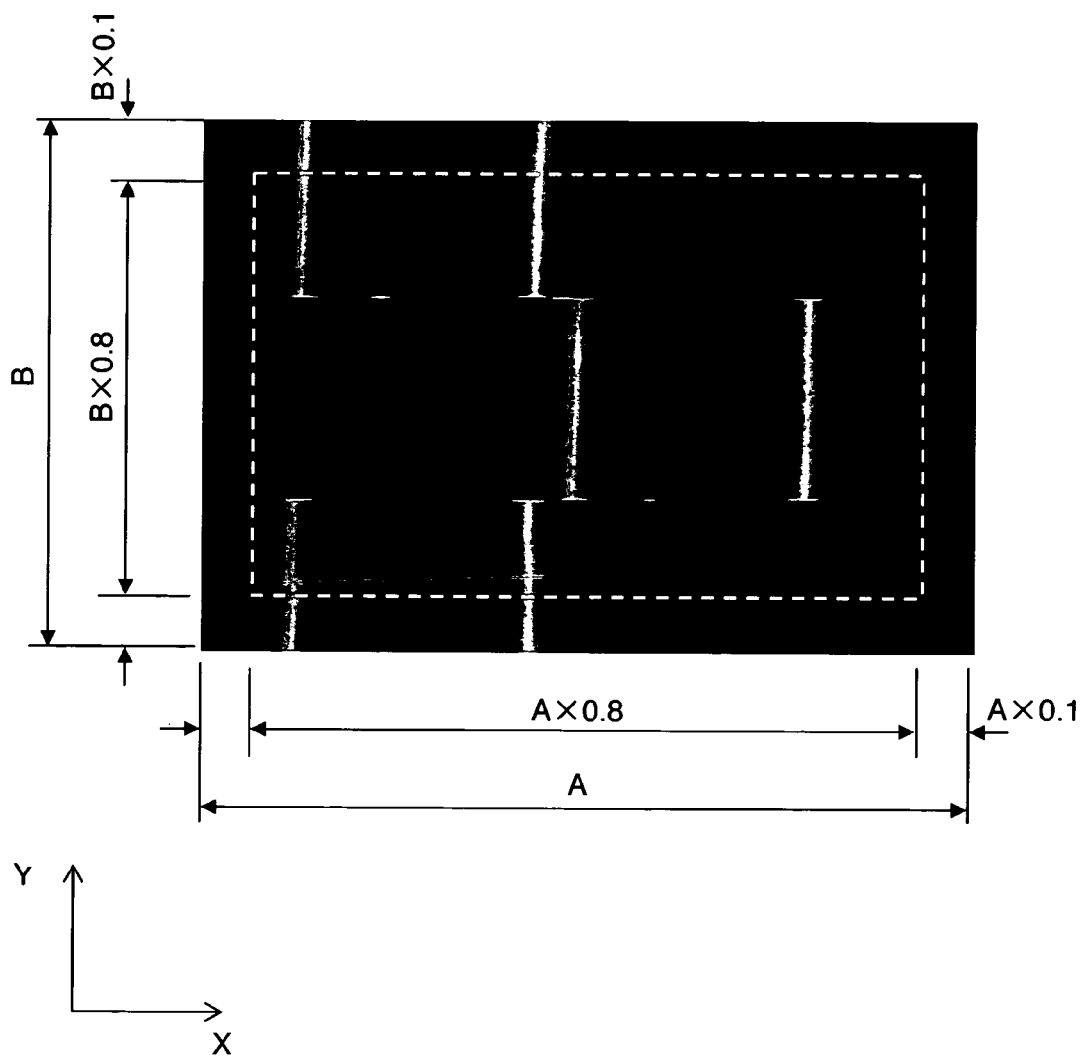
FIG. 10 is a diagram showing a case where the field of view was moved by using a beam deflector while taking pictures.

To solve the problem of specimen drift, while an image is being captured, voltage Vx in the X direction is applied to the electron beam deflector at Step 105. When a deflection voltage Vx in the X direction is applied, the image shifts as shown in FIG. 10.

Figure 7A:
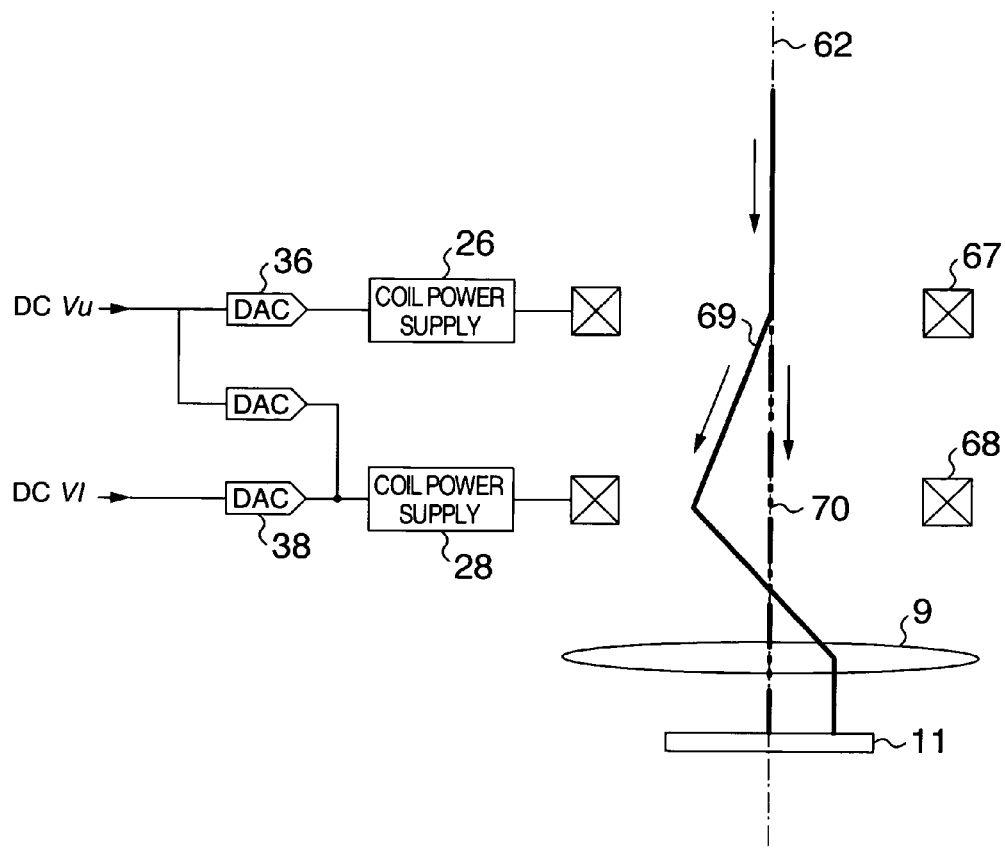
FIGS. 7A and 7B are diagrams showing the principle of an electron beam deflection mechanism.
Figure 7B:
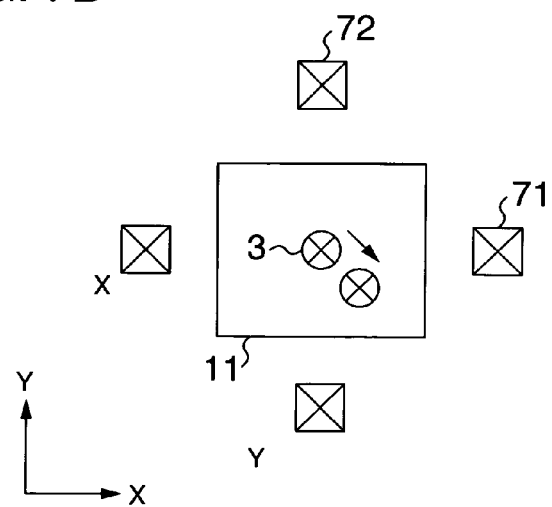

Using FIG. 7, description will be made of the principle of deflecting an electron beam. An electron beam 3 is emitted from the electron source 1, accelerated by the accelerating electrode 2, and moves along the optical axis 62 of the electron beam. Deflection coils 71, 72 are arranged to be concentric with the electron beam optical axis 62 and symmetric about the X axis and the Y axis. The deflection coils are arranged at the same position as the scanning coils 6 between the secondary condenser lens 5 and the objective condenser lens 9 as shown in FIG. 1, for example. The electron beam is acted on by forces by the upper deflection coil 67 and the lower deflection coil 68 and the deflected electron beam 69 is tilted as illustrated. The electron beam passes through the objective condenser lens 9 and direct currents are divided and applied to the upper and the lower deflection coils so that the electron beam 3 separates from the optical axis and is incident on the specimen. As a result, the electron beam on the optical axis shifts away on the specimen. To cite an example, the electron beam 3 is deflected to a direction to lower right in FIG. 7 by the voltages applied to the X deflection coil 71 and the Y deflection coil 72. The electron beam is deflected and scanned simultaneously, so that the field of view is also moved from the center to the lower-right direction on the specimen. In the manner described, by applying voltages to the deflection coils, it is possible to deflect the electron beam and move the field of view.

Figure 8:
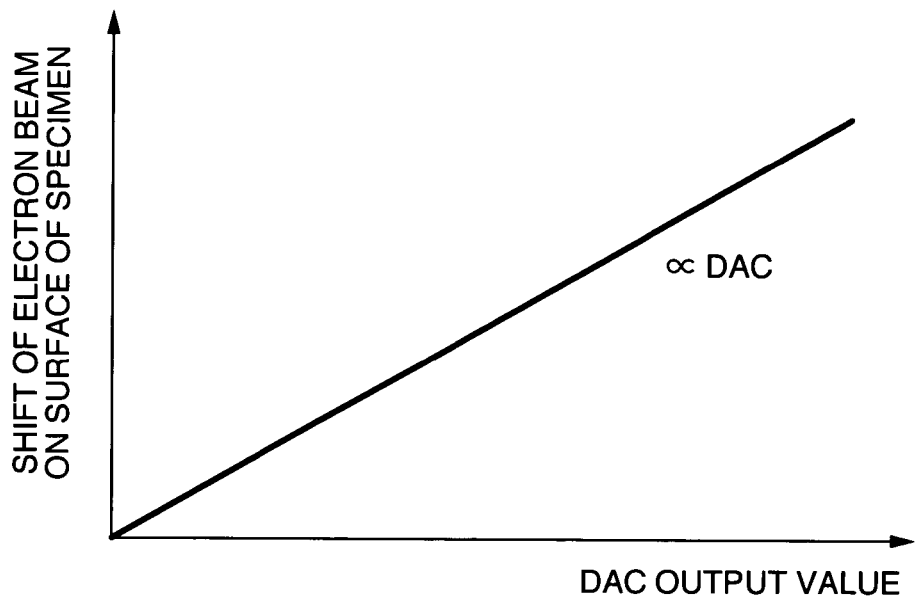
FIG. 8 is a diagram showing a relation between applied voltage of the deflection coil and amounts of beam shift on the surface of a specimen.
Figure 9:
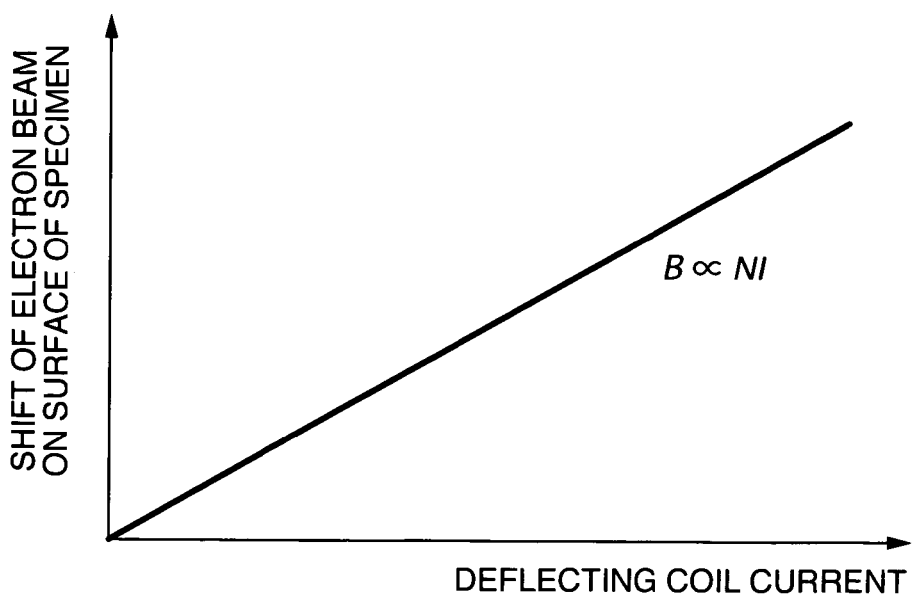
FIG. 9 is a diagram showing a relation between current applied to the deflection coil and amounts of shift of an electron beam on the surface of a specimen.

When the electron beam deflection coils are used, the output value of DAC for the deflection coils is proportional to the electron beam shift amount on the specimen as shown in FIG. 8. When air core coils with permeability 1 are used for the deflection coils, the strength of magnetic field B is a product of the number of turns N and current I and there is a linear relation between them as expressed by Equation (2) and as shown in FIG. 9.

$$B(T)=\mu_0 NI(A) \qquad (2)$$

In Equation (2), $\mu 0$ is the permeability in vacuum. Therefore, the shift amount of the electron beam on the specimen is also proportional to the deflection coil current. Since the electron beam deflection coils function independently of the scanning coils, even if the scanning waveform voltage applied to the scanning coils, that is, the observation magnification or the magnification range is changed, but this does not affect the shift amount of the electron beam on the specimen.

In Step 105 and Step 106, the voltage applied to the electron beam deflector is switched over, but response speed at switching is required to be fast. As shown in FIG. 10, the object of shifting the field of view in the same image is to eliminate the problem of specimen drift. Supposing that with the image size of 640 pixels (vertical)×480 pixels (horizontal), if time to capture one image is 20 s, it takes about 42 ms to scan one line. If, at a point in time, the specimen drift speed on the electron beam equipment is 0.1 nm/s, the amount of specimen drift for one line is 0.004 nm. At a time when the parallax by a specimen drift becomes less than one pixel, the voltage applied to the electron beam deflector is switched over. Since the applied voltage of the electron beam deflection circuit is switched ON and OFF by an electron switch in the control circuit, the switch-over time can be regarded as not more than 100 ms.

If the image size is A pixels (horizontal)×B pixels (vertical) in an image in FIG. 10, the amount of field-of-view shift by the electron beam deflector in Step 105 may be optional so long as an object field of view does not run off the range of not more than a maximum of 80% of the horizontal size A of the image. The reason why a limit of 80% of the horizontal size A of the image is set is to secure a field of view free of effects of distortion in consideration of occurrence of peripheral distortion of a specimen enlarged image. In other words, a requirement is that the structure in the field of view should be in an area of A×0.8 inside the 10% outer periphery portion of the image. In this embodiment, though the area secured in consideration of a peripheral distortion is 80% of the whole photographed image size, this value varies with charged particle beam equipment used and this 80% figure is not imperative.

In Step 106, the voltage applied to the electron beam deflector is cut off to bring the field of view back to the original position. In Step 107, the operation of turning ON and OFF the voltage applied to the electron beam deflector from Step 105 to Step 106 is repeated N times. The number of times N may be once or two times or more. By increasing the number of times N of repetition, the number of times of measuring the amount of parallax attending on a shift of the field of view can be increased. By increasing the number of times of parallax measurement, it becomes possible to derive an average value and obtain a variation or a standard deviation of measured values. Consequently, it becomes possible to improve the accuracy in correlation coefficient between the amount of parallax and the applied voltage of the electron beam deflector.

In Step 108, an image in which a shift in the field of view occurred as shown in FIG. 10 is stored, and the process moves on to Step 109, in which the parallax of the image is measured.

Referring to FIGS. 11A-11E and FIG. 12 which is a flowchart, description will be made of a method for measuring parallaxes in the same image. FIG. 11A shows an image in which the field of view was shifted twice in the same image. In FIG. 11A, a detecting area surrounded by a while border is selected.

In Step 201, a photographed image is subjected to smoothing to reduce noise in the image. The process then moves on to Step 202, and a cut-line position Yc in the Y direction is detected. The cut-line position corresponds to the position where the field of view was shifted by applying a voltage to the electron beam deflector. With regard to the cut-line position, there are two cases: one is a case where the field of view is shifted at a position set previously and the other is a case where the field of view is shifted at an arbitrary position. In a case where the field of view was shifted in a preset position, the process proceeds to Step 203. In the other case where the field of view was shifted in an arbitrary position, an algorithm for detecting a cut-line position from the detecting area is executed. As an example of an algorithm for detecting a cut-line position from the detecting area, there is a method which performs an image differential in the Y direction and a peak is detected in a one-dimensional image profile obtained by a projection process in the Y direction. The peak position is taken as a cut-line Yc of the image, and the process moves on to Step 203. The picture at the left of FIG. 11B is an image after an image process was executed to detect "cut-line in the Y direction", and the picture at the right is an image representing a line profile of the picture at the left.

In Step 203, an image differential in the X direction is performed as shown in FIG. 11C, and a differential profile of an image in the detecting area is output. Then, in Step 204, an offset amount Yδ is set from the cut-line Yc. In Step 205, at a position obtained by adding the offset amount Yδ to the cut-line position Yc, a result of adding up X-image differential profiles for n lines is obtained. The reason why the offset amount Yδ is set as described above is to take account of noise that can occur when voltage applied to the electron beam deflection coils are turned ON and OFF.

Figure 13:
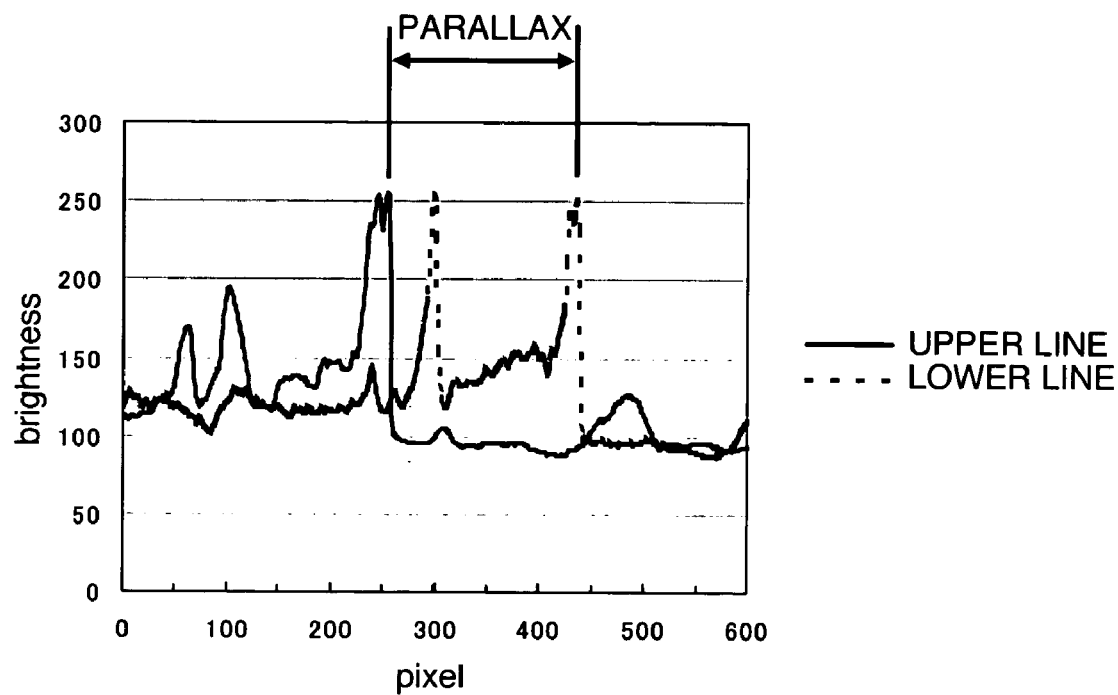
FIG. 13 is a diagram showing an X-direction differential profile before and after the field of view was shifted.

In Step 206, an amount of parallax is detected from the added-up differential profile of an image in the X direction. Among the methods for detecting parallax amounts, two methods will be described. One method is to detect a peak distance between differential profiles as a parallax amount, and the other method is to measure autocorrelation between differential profiles and, when the autocorrelation function takes a maximum value, obtain this value as a parallax amount (FIGS. 11D and 11E). An example of detection of a parallax amount from differential profiles in the X direction is shown in FIG. 13. The distance, indicated in FIG. 12 and marked with arrows in FIG. 13, corresponds to a parallax amount in an image. The measured parallax amount d is obtained in pixels. By using a length $P_{MO}$ per pixel (nm/pixel) at a current magnification (reference magnification $M_1$ in this case), dimension conversion is made to a distance dm (nm) by Equation (3).

$$Dm(nm) = d(pixels) \times P_{MO}(nm/pixel) \quad (3)$$

The relation between a shift amount and a DAC value V output to deflection coils is obtained as a unit shift amount $D_{MO}$ by Equation (4) as follows.

$$D_{MO}(nm/LSB) = dm(nm)/V(LSB) \quad (4)$$

In the above Equation, a DAC output value is V(LSB) (LSB means a minimum bit number of DAC).

Referring back to FIG. 6, after completing measurement of a parallax amount of an image by the electron beam deflector in the X direction in Step 109, and then in Step 110, the image is rotated 90°, and the process proceeds to the flow for magnification calibration in the Y direction. To rotate the image 90°, a raster rotation circuit is used. The raster rotation circuit is used to add an X-direction scanning signal and a Y-direction scanning signal and apply a current to the scanning coils to thereby rotate an observation image. When rotating the image 90°, the X-direction scanning signal is applied to the Y-direction scanning coil, and the Y-direction scanning signal is applied to the X-direction scanning coil.

Ideally, the scanning amounts when the X- and the Y-directions are swapped should be equal to those without this swapping, but in reality the magnetic field distribution is not necessarily equivalent what with coil fabrication errors and mounting errors. In other words, the difference in the above distribution results in magnification errors in the X-direction and the Y-direction. Therefore, magnification errors are to be measured in advance for cases where the raster rotation is 0° (OFF state) and 90°.

The process, which includes Steps 111 to 115, measures a parallax of an image after the image is rotated 90° in Step 110 is the same as the process from Step 104 to 109, excepting only that the X-direction and the Y-direction are transposed and, therefore, description of that process is omitted.

In the process from Step 117 on, a method is shown to calibrate magnification errors at an object observation magnification $M_2$. Initially, in Step 117, an object magnification is set. Step 118 is a process of measuring a parallax of an image in the X direction, which is the same as the process from Step 104 to Step 109; however, the voltage value applied to the electron beam deflector is the same as that applied in Step 105.

In Step 119, the image is rotated 90° by the raster rotation circuit. Step 120 is a process of measuring a parallax of an image in the Y direction, which is the same as the process from Step 111 to Step 116; however, the voltage value applied to the electron beam deflector is the same as that applied in Step 112.

Figure 14:
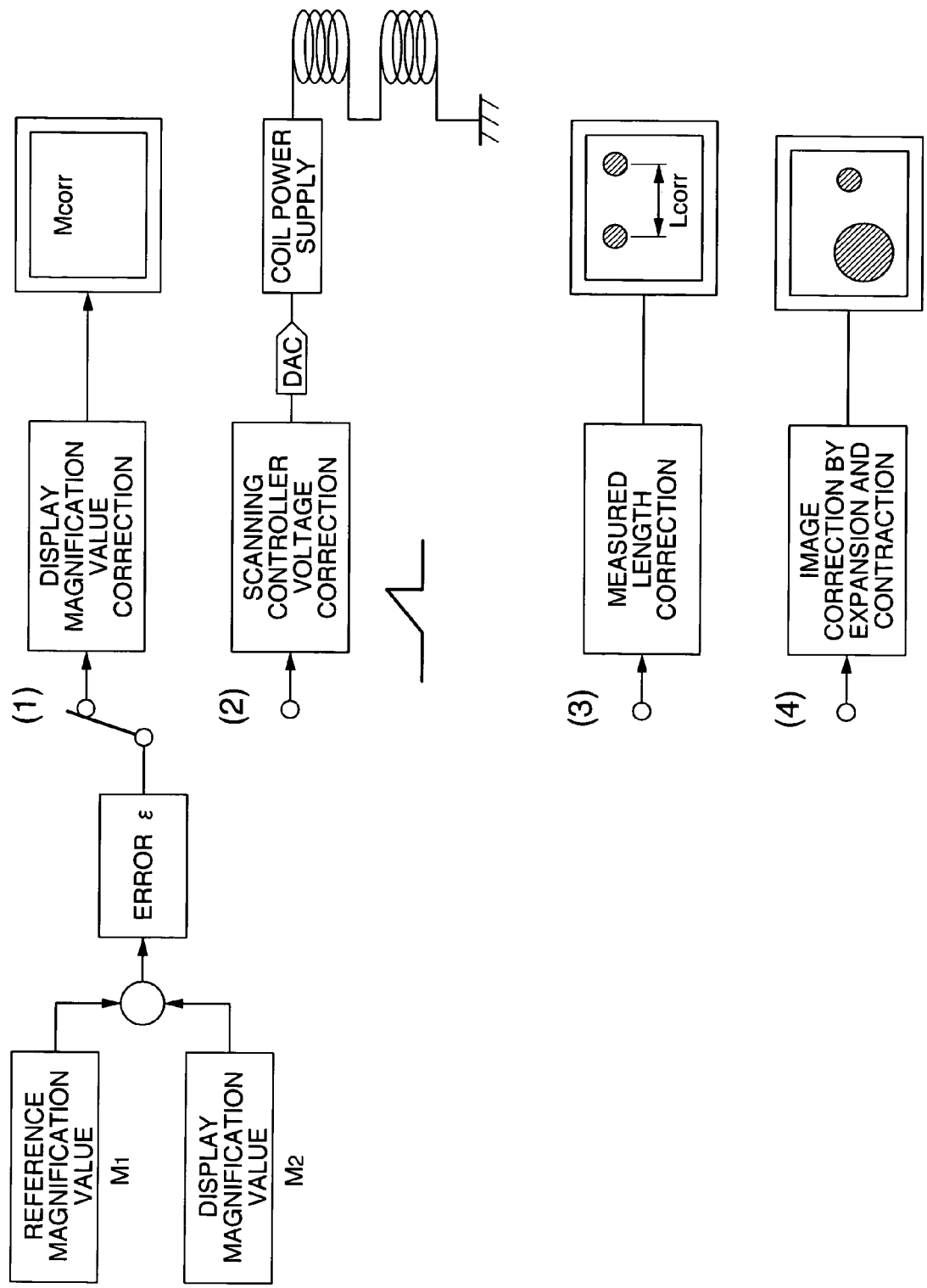
FIG. 14 is a diagram showing methods of magnification calibration, scanning voltage calibration, measured length value calibration, and image magnification calibration from calculation results of parallax errors.

In Step 121, an object magnification $M_2$ is calibrated. As for how to calibrate a magnification, four kinds of calibration methods will be described. FIG. 14 shows diagrams for explaining four kinds of magnification calibration methods (1) to (4). As illustrated, in the magnification calibration methods, there are (1) a method of calibrating a displayed value of an enlarging magnification displayed on the charged particle beam equipment, (2) a method of calibrating a scanning coil voltage, (3) a method of calibrating measured results of distances of the structure included in an observation image, and (4) a method of correcting an observation image by image processing, including expansion and contraction of an image on the basis of a magnification correction value.

By the following method, a magnification error $\epsilon$ in an object magnification and a measured magnification $M_0$ are obtained from the image parallax measured in Step 109 and the image parallax measured in Step 116. In a scanned image, though there is a possibility that the magnification differ in the X direction and the Y direction, only the magnification in the X direction will be described here.

The X-direction parallax in a reference magnification $M_1$ measured in Step 109 is denoted by $d_{M1x}$, and the X-direction parallax in a magnification $M_2$ measured in Step 118 is denoted as $d_{M2x}$. A true parallax $d_{M2x0}$ at the magnification M2 is obtained by Equation (5) as follows.

$$d_{M2x0} = M_2 \times (d_{M1x}/M_1) \quad (5)$$

An error $\epsilon x$ (%) in an X-direction parallax is expressed by Equation (6).

$$\epsilon_x = ((d_{M2x} - d_{M2x0})/d_{M2x0}) \times 100(\%) \quad (6)$$

A corrected magnification $M_{20}$ at the magnification $M_2$ is obtained by Equation (7).

$$M_{20}=M_2\times(1/(1+\epsilon_x/100)) \quad (7)$$

Figures 15, 16:
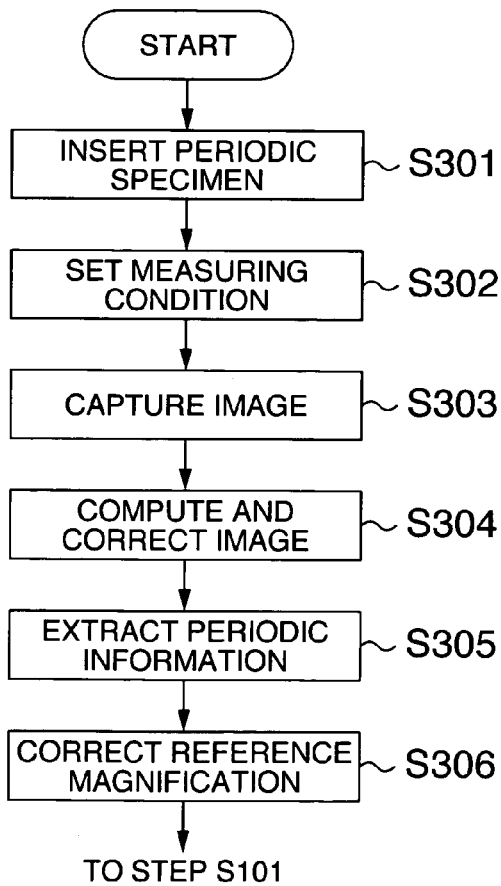
FIG. 15 is a table showing magnification data and correction data.
FIG. 16 is a flowchart showing a method of calibrating a reference magnification with a periodic specimen for providing a magnification standard.

The magnification error calculated as described is stored in a correction table 52 shown FIG. 1, which serves as a table of X-direction magnification errors and Y-direction magnification errors associated with display magnification. FIG. 15 shows an example of the correction data table.

As the magnification calibration method (1), description will be made of a method of calibrating a display value of an enlarging magnification displayed on the display part of charged particle beam equipment. This method displays a calibration magnification $M_{20}$ calculated by Equation (7) instead of the original display magnification $M_2$. It is possible to not only correct the magnification but also correct the value on the displayed scale bar.

As the magnification calibration method (2), description will be made of a method of calibrating a scanning coil voltage. This method calibrates the magnification of an image under observation by adjusting the scanning area by directly controlling a peak value of voltage waveform applied to the scanning coils based on a calibration result. The maximum peak value of the scanning voltage in the magnification $M_2$ is denoted as $V_2$. A correction voltage value $V_{20}$ is obtained by Equation (8) from a parallax error $\epsilon x$ in Equation (6).

$$V_{20}=V_2\times(1/(1+\epsilon_x/100)) \quad (8)$$

As the magnification calibration method (3), description will be made of a method of calibrating measured results of distances of the structure included in an observation image. Suppose, for example, that as a result of measurement, a distance between two points in a specific structure was obtained as L(nm). A correction length value $L_0$ is obtained by Equation (9) from a parallax in Equation (6) as follows.

$$L_0=L\times(1/(1+\epsilon_x/100)) \quad (9)$$

As the magnification calibration method (4), description will be made of a method of correcting an observation image by image processing, including expansion and contraction of an image on the basis of a magnification correction value. If a corrected magnification is $M_{20}$ for a display magnification $M_2$, a captured image is expanded or reduced in size by an image arithmetic operation in accordance with a X-direction parallax error $\epsilon_X$ and a Y-direction parallax error $\epsilon_y$. If the magnification $M_2$ of a photographed image is small in respect to the corrected magnification $M_{20}$, the observation image is expanded. In this expansion operation, linear interpolation or third-order interpolation is used. On the other hand, if the magnification $M_2$ is large in respect to the corrected magnification $M_{20}$, the observation image is contracted in size. In the contracting operation, a thinning-out reduction method or a smoothing reduction method is used.

Referring to a flowchart in FIG. 16, description will be made of a method of calibrating a reference magnification. A periodic specimen for magnification calibration, the dimension of which is known, is inserted in the charged particle beam equipment and observed, and period information is extracted to calibrate a reference magnification. After this, as the process proceeds to Step 101 in FIG. 6, it becomes possible to perform magnification calibration in accordance with a magnification calibration specimen at a magnification other than the reference magnification.

Figure 2A:
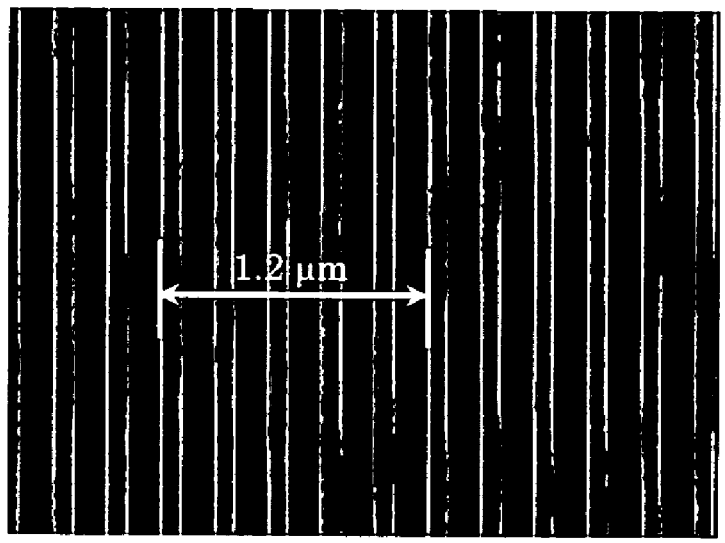
FIGS. 2A and 2B are diagrams showing an example of specimen for calibrating the dimensions on the charged particle beam equipment.
Figure 2B:
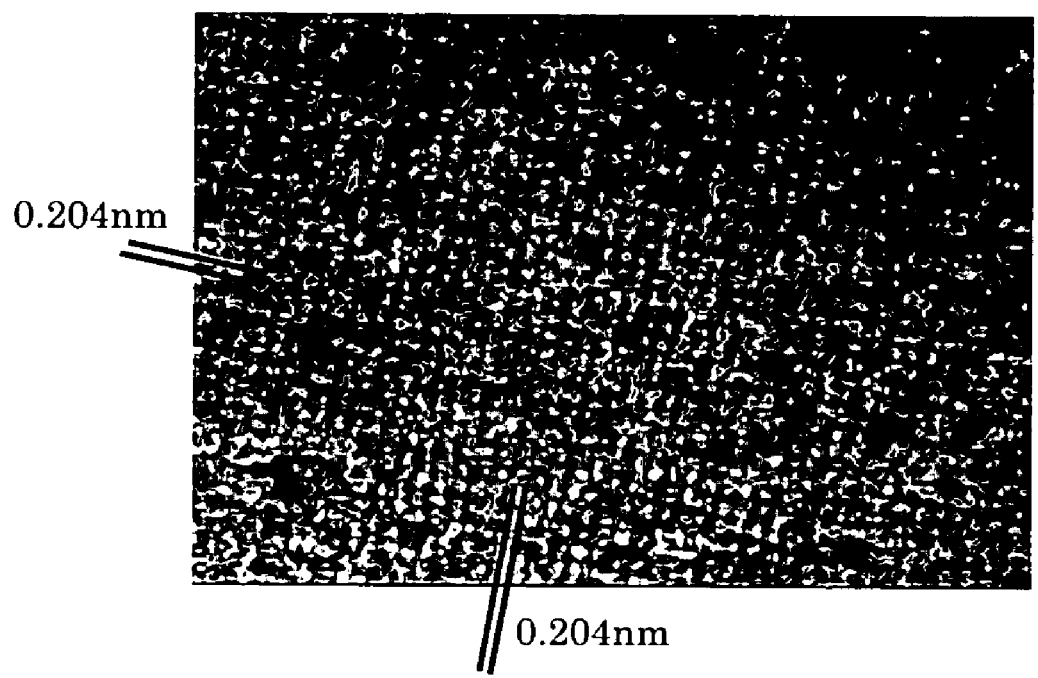

Firstly, at Step 301, a specimen for magnification calibration of periodic structure is inserted. For this specimen, a microscale specimen with a pitch of 0.24 μm such as shown in FIG. 2A or a gold single crystal thin film with a pitch of 0.204 nm as shown in FIG. 2B are used. In Step 302, a magnification and an electron-beam irradiation condition, for example, are set. As the reference magnification, a magnification is set, which allows a periodic structure intrinsic to a specimen to be observed sufficiently. For example, for a gold single crystal thin film, the reference magnification $M_1$ is set at 3 million times or higher.

Then, in Step 303, an image is captured. A scanning speed in capturing an image should preferably be as high as possible, in consideration of a specimen drift. A specimen enlarged image for magnification calibration is captured, data is transferred to a periodic image processing part 47, and in Step 304, an image arithmetic operation is performed, and in Step 305, period information is extracted. In Step 304, a histogram of a periodic structure image is calculated by a contrast conversion device 61 as shown in FIG. 1, and if it is decided from arithmetic operation results that the contrast is low, the contrast is corrected automatically. The contrast conversion device 61 comprises a captured image's histogram arithmetic operation part, a comparator, an electron beam detector, an offset voltage regulator for the electron beam detector and the minute electric current amplifier, and a amplification gain regulator. By comparing with an optimum histogram, the contrast conversion device 61 automatically adjusts the offset voltage and the amplification gain. The contrast correction may be performed by image processing by software, in which case a histogram arithmetic operation unit, a comparator, a gamma corrector, a luminance corrector, and a lightness corrector are provided.

Figure 17A:
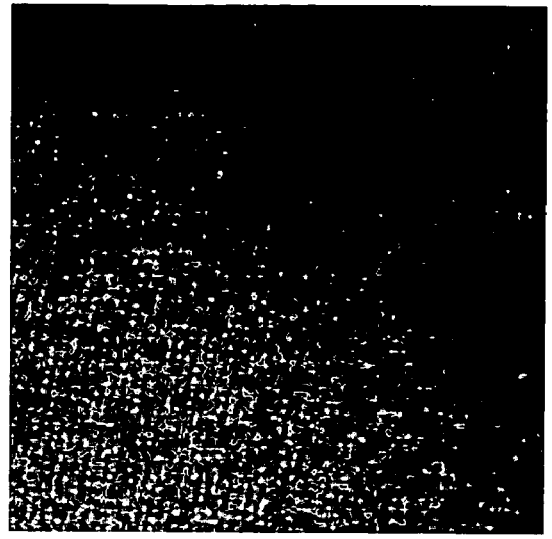
FIGS. 17A and 17B are pictures showing an example of periodic structure specimen and an example of image obtained by executing fast Fourier conversion on the periodic structure specimen.
Figure 17B:
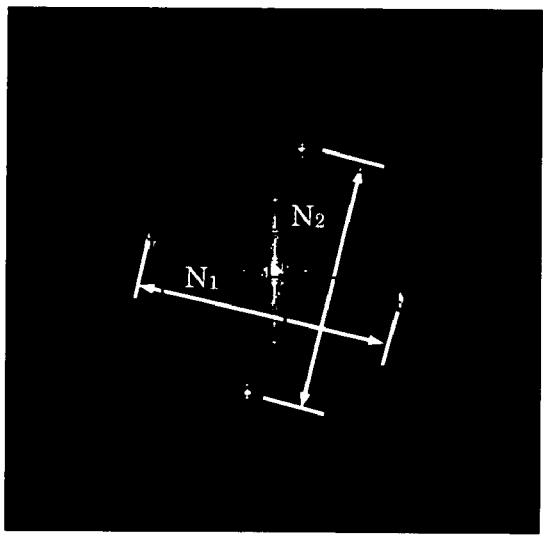

In Step 305, period information is extracted from the specimen with a periodic structure for magnification composition. FIG. 17A shows an example of image of a specimen with a periodic structure, and FIG. 17B shows a fast Fourier transformed image (FFT) of that image. The four points of peripheral spot represent period information. As a way of extracting information about a periodic-structure specimen, an example using FFT is shown here, but this information may be obtained by autocorrelation. The principle of the FFT process is not mentioned but only a method of calculating a lattice spacing is described. A square-shaped area of 2 to the nth power pixels is cut out of a specimen enlarged image for the FFT process. When the specimen enlarged image is recorded with a pixel size of 640×480 pixels, for example, the FFT process area is 256×256 pixels or 128×128 pixels and a $2^8$ pixel area and a $2^7$ pixel area. When a specimen enlarged image is recorded with a pixel size of 1024×768 pixels, the FFT process is performed with 512×512 pixels. Period information appears as a luminescent spot with maximum intensity at a space frequency corresponding to an average value of the periods. The luminescent spot at the center of an FFT image indicates the DC component of the image, and has no relation with the periodic structure. The significant luminescent spots are four luminescent spots surrounding the center. From the spatial frequency coordinates of those spots, an average period (pitch) of the periodic structure can be obtained.

If the FFT image size is 512 pixels (vertical)×512 pixels (horizontal), I is 512 pixels, so that the average pitch is obtained by Equation (10):

$$\text{Average pitch Lp (pixels)}=I(\text{pixels})/N_1 \text{ (FFT luminescent spot distance)} \quad (10)$$

In an example of FIG. 17B, the distance $N_1$ between luminescent spots is 47.07 pixels, and an average pitch Lp is obtained as 10.88 pixels by Equation (10). A measured pitch distance Ld is obtained by Equation (11).

$$\text{Measured pitch distance Ld(nm)}=Lp\times P_{M10} \quad (11)$$

A magnification $M_1$ of a specimen enlarged image is 5 million times, and a true length per pixel at this time, namely, pixel size $P_{M10}$ is $2 \times 10^{-11}$ (m/pixel). Therefore, a measured pitch distance is calculated by Equation (11) as follows.

$$10.88 \times 2 \times 10^{-11} = 0.2118 \text{ (nm)}$$

In Step 306, by comparing a measured pitch distance Ld and a gold lattice spacing (Lstd) of 0.204 nm, a magnification error e at this magnification is obtained.

$$\text{Magnification error } \epsilon = (Ld - Lstd)/Lstd \tag{12}$$

By substituting actual values for Ld and Lstd in Equation (12), we have $(0.2118(\text{nm}) - 0.204(\text{nm}))/0.204(\text{nm}) = 0.038$. This 0.038 is a magnification error at the reference magnification. A magnification correction value at the reference magnification is obtained by Equation (13) as by Equation (7).

$$M_{10} = M_1 \times (1/(1 + \epsilon/100)) \tag{13}$$

A parallax amount at the reference magnification $M_1$, which is obtained in Steps 109 and 116 is obtained by Equation (14) and Equation (15) for the X direction and the Y direction, respectively.

$$d_{M1x0} \times = d_{M1x} \times (1/(1 + \epsilon/100)) \tag{14}$$

$$d_{M1Y0} \times = d_{M1Y} \times (1/(1 + \epsilon/100)) \tag{15}$$

Referring to a flowchart of FIG. 18, description will be made of a function to display a specimen rotating angle when calibrating a magnification by using a specimen with a periodic structure at the reference magnification.

The process from Step 401 to Step 404 is the same as the process from Step 301 to Step 305 in FIG. 16. In Step 401, a specimen with a periodic structure like a gold single crystal thin film specimen, for example, is inserted in the charged particle equipment, in Step 402, a magnification M1 is set and an electron beam irradiation condition is set. In Step 403, an enlarged image of the specimen is photographed, and in Step 404, fast Fourier transform of that enlarged image is performed.

Figure 19A:
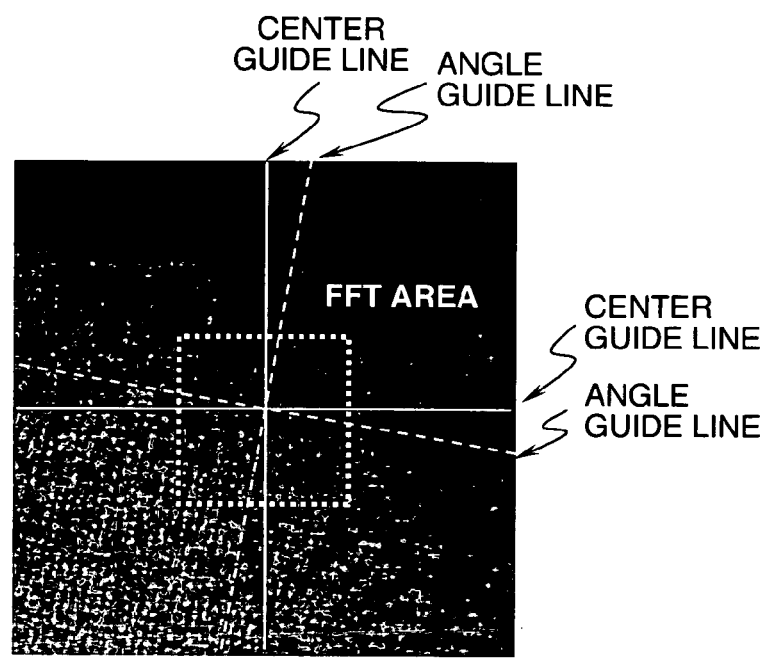
FIGS. 19A and 19B are diagrams showing examples of a periodic image for magnification standard and a FFT image, and a specimen rotation angle shown on the display device.
Figure 19B:
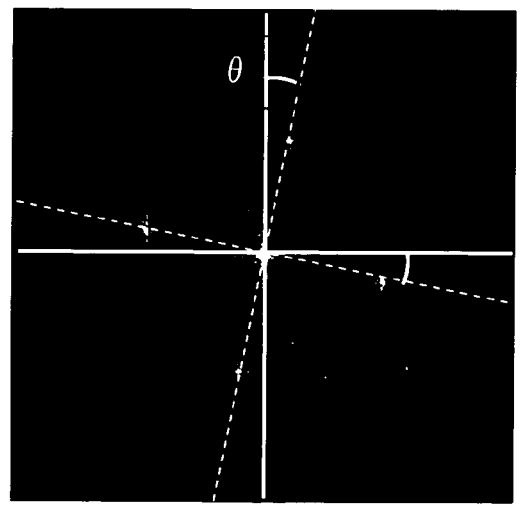

In Step 405, the fast Fourier transformed image along with the specimen enlarged image is displayed on the monitor as shown in FIGS. 19A and 19B. At the same time, in Step 406, a barycentric position of the luminescent spot of the FFT image is detected. The barycentric position is searched by using a blob method in image processing. In the blob method, for a luminescent spot equal to or larger than an arbitrary area, its coordinates and barycentric position can be calculated. In Step 407, as a result of calculating the luminescent spot position, a linear line connecting the luminescent spot position through the origin is calculated. Since luminescent spots are invariably arranged symmetric about the origin in the FFT image, if given luminescent spot positions are (P1, P2), a straight line y can be obtained by Equation (16).

$$y = (P2/P1) \cdot x \tag{16}$$

In Step 408, the straight line based on Equation (16) is displayed as shown in FIG. 19B. In Step 410, the specimen rotating angle is displayed. The specimen rotating angle θ is given by Equation (17).

$$\theta = \tan^{-1}(P2/P1) \tag{17}$$

The specimen rotating angle θ given by Equation (17) is always displayed along with the FFT image on the display as shown in FIGS. 19A and 19B.

In Step 114, the specimen is rotated by using a specimen driven device 20. The specimen is rotated by using the specimen drive device 20 so that the specimen rotating angle given by Equation (17) is set to 0°.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam equipment, comprising:
a charged particle beam source for generating a charged particle beam;
a specimen stage for holding and moving a specimen;
a lens system for focusing said charged particle beam on said specimen;
a scanner for scanning said charged particle beam on said specimen;
a beam deflector for deflecting said charged particle beam;
a detector for detecting a specimen signal generated by said specimen upon irradiation by said charged particle beam;
an arithmetic processing part for an image operation; and
a display part for displaying a specimen image,
wherein said scanner scans said charged particle beam in accordance with reference magnification and object magnification, said beam deflector deflects said charged particle beam to which said scanning is carried out in accordance with setting of said reference magnification and object magnification at a predetermined value, and said arithmetic processing part calculates magnification error at said object magnification in accordance with the following formula:
measured displacement amount at target magnification—target magnification×(displacement amount at reference magnification/reference magnification).

2. A charged particle beam equipment, comprising:
a charged particle beam source for generating a charged particle beam;
a specimen stage for holding and moving a specimen;
a lens system for focusing said charged particle beam on said specimen;
a scanner for scanning said charged particle beam on said specimen;
a beam deflector for deflecting said charged particle beam;
a detector for detecting a specimen signal generated by said specimen upon irradiation by said charged particle beam;
an arithmetic processing part for an image operation; and
a display part for displaying a specimen image, wherein:
on the basis of a displacement of the field of view before and after a deflection of said charged particle beam, extracted from a first specimen image, including a displacement of the field of view recorded by causing said charged particle beam to deflect by the beam deflector by a predetermined amount in an image where said specimen image is captured at a first magnification and also a displacement of the field of view before and after a deflection of said charged particle beam, extracted from a second specimen image, including a displacement of the field of view recorded by causing said charged particle beam to deflect by said beam deflector by a predetermined amount in an image where said specimen image is captured at a second magnification, an amount of magnification error in said second magnification is made equal to an amount of magnification error in said first magnification; and
on the basis of a displacement of the field of view before and after a deflection of said charged particle beam, extracted from said first sample image and also a displacement of the field of view before and after a deflection of said charged particle beam, extracted from said second specimen image, an error of a scanning signal of said scanner at said second magnification becomes equal to an error of voltage value of a scanning signal of said scanner at said first magnification.

3. A charged particle beam equipment, comprising:
a charged particle beam source for generating a charged particle beam;
a specimen stage for holding and moving a specimen;
a lens system for focusing said charged particle beam on said specimen;
a scanner for scanning said charged particle beam on said specimen;
a beam deflector for deflecting said charged particle beam;
a detector for detecting a specimen signal generated by said specimen upon irradiation by said charged particle beam;
an arithmetic processing part for an image operation; and
a display part for displaying a specimen image, wherein:
on the basis of a displacement of the field of view before and after a deflection of said charged particle beam, extracted from a first specimen image, including a displacement of the field of view recorded by causing said charged particle beam to deflect by the beam deflector by a predetermined amount in an image where said specimen image is captured at a first magnification and also a displacement of the field of view before and after a deflection of said charged particle beam, extracted from a second specimen image, including a displacement of the field of view recorded by causing said charged particle beam to deflect by said beam deflector by a predetermined amount in an image where said specimen image is captured at a second magnification, an amount of magnification error in said second magnification is made equal to an amount of magnification error in said first magnification; and
on the basis of a displacement of the field of view before and after a deflection of the charged particle beam, extracted from said first sample image and also a displacement of the field of view before and after a deflection of said charged particle beam, extracted from said second specimen image, said specimen image photographed at said second magnification is adjusted by expansion or contraction by said arithmetic processing part so that a magnification error of said specimen image photographed at said second magnification becomes equal to a magnification error of said specimen image photographed at said first magnification.

4. The charged particle beam equipment according to claim 3, wherein on the basis of a displacement of the field of view before and after a deflection of said charged particle beam, extracted from said first sample image and also a displacement of the field of view before and after a deflection of said charged particle beam, extracted from said second specimen image, an error of a dimensional measured value of said specimen observed at said second magnification is made equal to an error of dimensional measured value of said specimen observed at said first magnification.

5. A charged particle beam equipment, comprising:
a charged particle beam source for generating a charged particle beam;
a specimen stage for holding and moving a specimen;
a lens system for focusing said charged particle beam on said specimen;
a scanner for scanning said charged particle beam on said specimen;
a beam deflector for deflecting said charged particle beam;
a detector for detecting a specimen signal generated by said specimen upon irradiation by said charged particle beam;
an arithmetic processing part for an image operation; and
a display part for displaying a specimen image,
wherein on the basis of a displacement of the field of view before and after a deflection of said charged particle beam, extracted from a first specimen image, including a displacement of the field of view recorded by causing said charged particle beam to deflect by a predetermined amount by said beam deflector in an image where a specimen image is captured at a first magnification calibrated by using a specimen enlarged image of a specimen as a magnification standard and also a displacement of the field of view before and after a deflection of said charged particle beam, extracted from a second specimen image, including a displacement of the field of view recorded by causing the charged particle beam to deflect by said predetermined amount by said beam deflector in an image where a specimen image is captured at a second magnification, said second magnification is calibrated; and
wherein on the basis of a displacement of the field of view before and after a deflection of said charged particle beam, extracted from said first specimen image and also a displacement of the field of view before and after a deflection of said charged particle beam, extracted from said second specimen image, a scanning signal of said scanner at said second magnification is adjusted.

6. A charged particle beam equipment, comprising:
a charged particle beam source for generating a charged particle beam;
a specimen stage for holding and moving a specimen;
a lens system for focusing said charged particle beam on said specimen;
a scanner for scanning said charged particle beam on said specimen;
a beam deflector for deflecting said charged particle beam;
a detector for detecting a specimen signal generated by said specimen upon irradiation by said charged particle beam;
an arithmetic processing part for an image operation; and
a display part for displaying a specimen image, wherein:
on the basis of a displacement of the field of view before and after a deflection of said charged particle beam, extracted from a first specimen image, including a displacement of the field of view recorded by causing said charged particle beam to deflect by a predetermined amount by said beam deflector in an image where a specimen image is captured at a first magnification calibrated by using a specimen enlarged image of a specimen as a magnification standard and also a displacement of the field of view before and after a deflection of said charged particle beam, extracted from a second specimen image, including a displacement of the field of view recorded by causing the charged particle beam to deflect by said predetermined amount by said beam deflector in an image where a specimen image is captured at a second magnification, said second magnification is calibrated; and
on the basis of a displacement of the field of view before and after a deflection of said charged particle beam, extracted from said first specimen image and also a displacement of the field of view before and after a deflection of said charged particle beam, extracted from said second specimen image, said specimen image photographed at said second magnification is adjusted by expansion or contraction of the image by said arithmetic processing part.

7. The charged particle beam equipment according to claim 6, wherein on the basis of a displacement of the field of view before and after a deflection of said charged particle beam, extracted from said first specimen image and also a displacement of the field of view before and after a deflection of said charged particle beam, extracted from said second specimen image, a dimensional measured value of a specimen observed at said second magnification is calibrated.

8. The charged particle beam equipment according to claim 6, wherein a correction data table is provided which records a magnification error in each observation condition.

9. The charged particle beam equipment according to claim 6, wherein a correction data table is provided which records an X-direction magnification error and a Y-direction magnification error in an image in each observation condition.

10. The charged particle beam equipment according to claim 6, wherein a specimen with a periodic structure is used as a specimen to serve as a magnification standard.

11. The charged particle beam equipment according to claim 6, wherein a time for image capture is variable.

12. The charged particle beam equipment according to claim 6, wherein an area for image processing by said arithmetic processing part can be changed.

13. The charged particle beam equipment according to claim 6, wherein more than one displacement of the field of view by said beam deflector is included in one image.

14. The charged particle beam equipment according to claim 6, wherein a specimen with a line pattern is used as a specimen for measuring a displacement of the field of view.

15. The charged particle beam equipment according to claim 6, wherein a displaced position of said field of view is detected by a linear differential of the image.

16. The charged particle beam equipment according to claim 6, wherein said arithmetic processing part detects a displacement of the field of view before and after a deflection of said charged particle beam by a linear differential profile of the image.

17. The charged particle beam equipment according to claim 6, wherein said arithmetic processing part detects a displacement of the field of view before and after a deflection of said charged particle beam by applying an autocorrelation function to a linear differential profile of the image.

18. The charged particle beam equipment according to claim 6, further comprising a contrast converter for automatic correction of the quality of a specimen enlarged image of a specimen to serve as a magnification standard.

19. A charged particle beam equipment, comprising:
a charged particle beam source for generating a charged particle beam;
a specimen stage for holding and moving a specimen;
a lens system for focusing said charged particle beam on said specimen;
a scanner for scanning said charged particle beam on said specimen;
a beam deflector for deflecting said charged particle beam;
a detector for detecting a specimen signal generated by said specimen upon irradiation by said charged particle beam;
an arithmetic processing part for an image operation;
a display part for displaying a specimen image; and
a specimen enlarged image display part and an image rotation computing part, wherein:
when magnification calibration is performed by using a specimen with periodicity in the orthogonal directions, the azimuth of the periodic structure of said specimen is shown in an inverse space image;
on the basis of a displacement of the field of view before and after a deflection of said charged particle beam, extracted from a first specimen image, including a displacement of the field of view recorded by causing said charged particle beam to deflect by a predetermined amount by said beam deflector in an image where a specimen image is captured at a first magnification calibrated by using a specimen enlarged image of a specimen as a magnification standard and also a displacement of the field of view before and after a deflection of said charged particle beam, extracted from a second specimen image, including a displacement of the field of view recorded by causing the charged particle beam to deflect by said predetermined amount by said beam deflector in an image where a specimen image is captured at a second magnification, said second magnification is calibrated; and
by using a specimen with periodicity in orthogonal directions, magnification calibration is performed in the X-direction and the Y-direction of the image plane independently of each other.

20. The charged particle beam equipment according to claim 19, further comprising a specimen enlarged image display part and an image rotation computing part, wherein when magnification calibration is performed by using a specimen with periodicity in the orthogonal directions, a rotating angle of a periodic structure of said specimen is shown on said display part.

21. A charged particle beam equipment, comprising:
a charged particle beam source for generating a charged particle beam;
a specimen stage for holding and moving a specimen;
a lens system for focusing said charged particle beam on said specimen;
a scanner for scanning said charged particle beam on said specimen;
a beam deflector for deflecting said charged particle beam;
a detector for detecting a specimen signal generated by said specimen upon irradiation by said charged particle beam;
an arithmetic processing part for an image operation;
a display part for displaying a specimen image;
a specimen enlarged image display part and an image rotation computing part, wherein:
when magnification calibration is performed by using a specimen with periodicity in the orthogonal directions, the azimuth of the periodic structure of said specimen is shown in an enlarged image of a specimen with periodicity in orthogonal directions;
on the basis of a displacement of the field of view before and after a deflection of said charged particle beam, extracted from a first specimen image, including a displacement of the field of view recorded by causing said charged particle beam to deflect by a predetermined amount by said beam deflector in an image where a specimen image is captured at a first magnification calibrated by using a specimen enlarged image of a specimen as a magnification standard and also a displacement of the field of view before and after a deflection of said charged particle beam, extracted from a second specimen image, including a displacement of the field of view recorded by causing the charged particle beam to deflect by said predetermined amount by said beam deflector in an image where a specimen image is captured at a second magnification, said second magnification is calibrated; and by using a specimen with periodicity in orthogonal directions, magnification calibration is performed in the X-direction and the Y-direction of the image plane independently of each other.

22. A charged particle beam equipment, comprising:
a charged particle beam source for generating a charged particle beam;
a specimen stage for holding and moving a specimen;
a lens system for focusing said charged particle beam on said specimen;
a scanner for scanning said charged particle beam on said specimen;
a beam deflector for deflecting said charged particle beam;
a detector for detecting a specimen signal generated by said specimen upon irradiation by said charged particle beam;
an arithmetic processing part for an image operation;
a display part for displaying a specimen image;
a specimen drive device, wherein:
the azimuth of the periodic structure of a specimen with periodicity in orthogonal directions is detected, said specimen is rotated by said specimen drive device, and an X-direction magnification and a Y-direction magnification are calibrated independently of each other;

wherein on the basis of a displacement of the field of view before and after a deflection of said charged particle beam, extracted from a first specimen image, including a displacement of the field of view recorded by causing said charged particle beam to deflect by a predetermined amount by said beam deflector in an image where a specimen image is captured at a first magnification calibrated by using a specimen enlarged image of a specimen as a magnification standard and also a displacement of the field of view before and after a deflection of said charged particle beam, extracted from a second specimen image, including a displacement of the field of view recorded by causing the charged particle beam to deflect by said predetermined amount by said beam deflector in an image where a specimen image is captured at a second magnification, said second magnification is calibrated; and wherein by using a specimen with periodicity in orthogonal directions, magnification calibration is performed in the X-direction and the Y-direction of the image plane independently of each other.

* * * * *